United States Patent
Obuchi et al.

(10) Patent No.: US 10,991,864 B2
(45) Date of Patent: Apr. 27, 2021

(54) LED PACKAGE AND LED DISPLAY DEVICE

(71) Applicant: Rohm Co., Ltd., Kyoto (JP)

(72) Inventors: Hirotaka Obuchi, Kyoto (JP); Junichi Itai, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/528,963

(22) Filed: Aug. 1, 2019

(65) Prior Publication Data
US 2020/0052173 A1 Feb. 13, 2020

(30) Foreign Application Priority Data
Aug. 8, 2018 (JP) .............................. JP2018-149216

(51) Int. Cl.
*H01L 33/62* (2010.01)
*H01L 33/48* (2010.01)
*H01L 33/58* (2010.01)
*H01L 33/54* (2010.01)

(52) U.S. Cl.
CPC ............ *H01L 33/62* (2013.01); *H01L 33/486* (2013.01); *H01L 33/54* (2013.01); *H01L 33/58* (2013.01)

(58) Field of Classification Search
CPC ..... H01L 33/00–648; H01L 27/15–156; H01L 2933/00–0091; H01L 51/50–56; H01L 51/0032–0095; H01L 27/32–3297; H01L 2251/50–568; H01L 2224/49107; H01L 2224/73265; H01L 2224/32225; H01L 25/0753
See application file for complete search history.

(56) References Cited

U.S. PATENT DOCUMENTS

| | | | |
|---|---|---|---|
| 2017/0062663 A1* | 3/2017 | Hayashi | .................. H01L 33/62 |
| 2017/0170200 A1* | 6/2017 | Ikeda | .................... G09G 3/2003 |
| 2019/0312188 A1* | 10/2019 | Kayama | ............ H01L 23/49586 |

FOREIGN PATENT DOCUMENTS

JP          2010067862 A          3/2010

* cited by examiner

*Primary Examiner* — Shahed Ahmed
(74) *Attorney, Agent, or Firm* — Hamre, Schumann, Mueller & Larson, P.C.

(57) ABSTRACT

An LED package includes a substrate with a front surface and a back surface spaced apart from each other in a thickness direction of the substrate. First and second wirings are formed on the substrate. An LED chip is mounted on the front surface of the substrate and electrically connected to the first and second wirings. A sealing resin, such as silicone, covers the LED chip. The substrate is made up of glass cloths laminated in the thickness direction and an impregnated resin, such as acrylic resin, impregnated in the glass cloths.

16 Claims, 22 Drawing Sheets

LED PACKAGE AND LED DISPLAY DEVICE

FIELD

The present disclosure relates to an LED package and an LED display device.

BACKGROUND

JP-A-2010-67862 discloses an example of an LED package (or packaged LED). The conventional LED package includes a resin container having an upwardly open recess, a pair of leads arranged in the resin container such that portions of the leads are exposed at the bottom of the recess, and an LED chip (semiconductor light-emitting element) mounted on one of the leads. The LED chip is electrically connected to the leads via wires, respectively. The recess is filled with sealing resin to cover the LED chip. The sealing resin is a transparent resin (e.g., silicone) containing phosphor powder.

The above configuration of the sealing resin improves the durability of the resin against light emitted from the LED chip thanks to a decrease in benzene rings per unit volume of the sealing resin. Accordingly, the amount of luminous flux emitted from the LED package is stabilized over a long period of time. In recent years, in response to the need for size reduction of an LED package, a thin substrate made of a resin may be used in place of the resin container disclosed in JP-A-2010-67862, and an LED chip is mounted on the resin substrate. In an LED package including such a resin substrate and a sealing resin of the above-noted configuration, the amount of luminous flux entering the resin substrate will increase as the durability of the sealing resin improves, which leads to deterioration of the resin substrate. Unfavorably, as the deterioration of the resin substrate progresses, the amount of luminous flux emitted from the LED package is reduced.

SUMMARY

In view of the above circumstances, an object of the present disclosure is to provide an LED package that is reduced in size and capable of stabilizing the emission of luminous flux over a long period of time, while also providing an LED display device incorporating such an LED package.

According to a first aspect of the present disclosure, there is provided an LED package including: a substrate having a front surface and a back surface that are spaced apart from each other in a thickness direction; first wiring and second wiring arranged on the substrate; an LED chip mounted on the front surface and electrically connected to the first wiring and the second wiring; and a sealing resin covering the LED chip. The substrate is made up of a plurality of glass cloths laminated in the thickness direction and an impregnated resin impregnated in the plurality of glass cloths. The impregnated resin may be acrylic resin, and the sealing resin may be silicone.

According to a second aspect of the present disclosure, there is provided an LED display device including: an LED package in accordance with the above first aspect; amounting substrate on which the LED package is mounted; and a housing surrounding the LED package, where a gap is formed between the mounting substrate and the housing in the thickness direction. The substrate of the LED package has a thickness that is larger than the spacing of the gap.

Further features and advantages of the present disclosure will become apparent from the following detailed description with reference to the attached drawings.

DRAWINGS

EMBODIMENTS

The following describes embodiments for implementing the present disclosure, with reference to the attached drawings.

First, an LED package A10 according to a first embodiment of the present disclosure will be described with reference to FIGS. 1 to 14.

Figure 1:
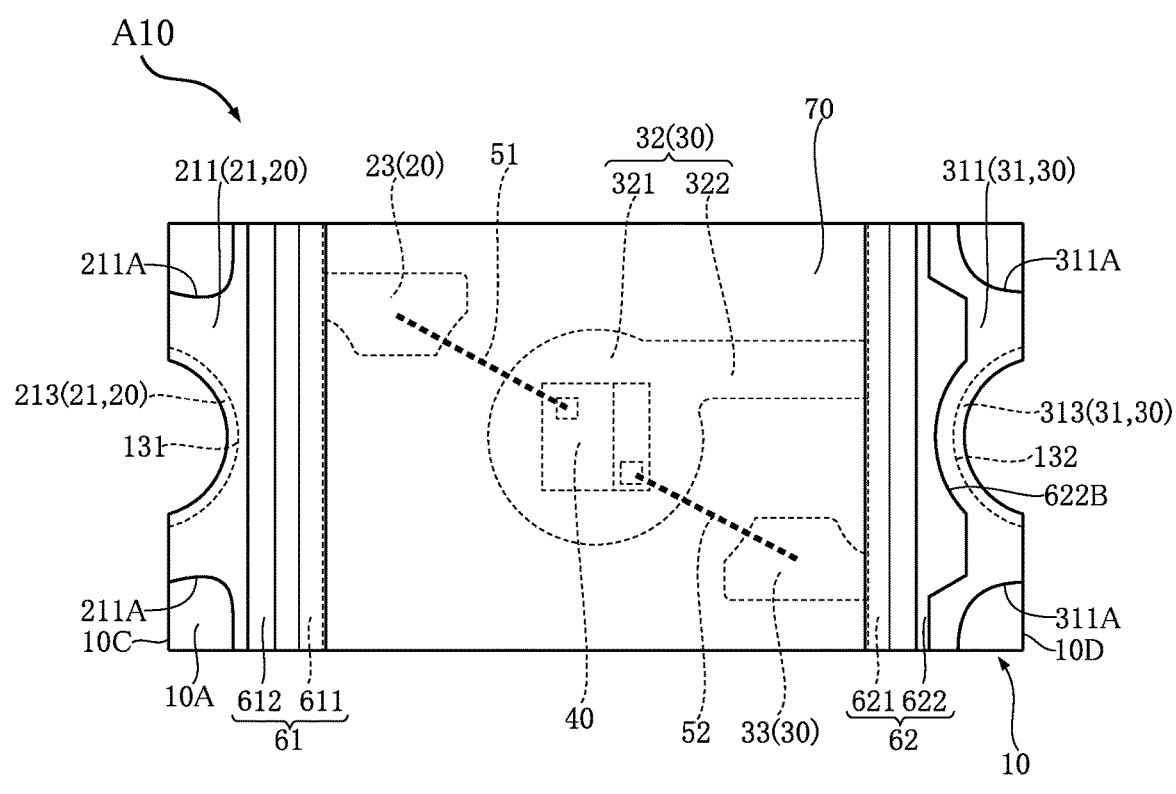
FIG. 1 is a plan view showing an LED package according to a first embodiment of the present disclosure.
Figure 2:
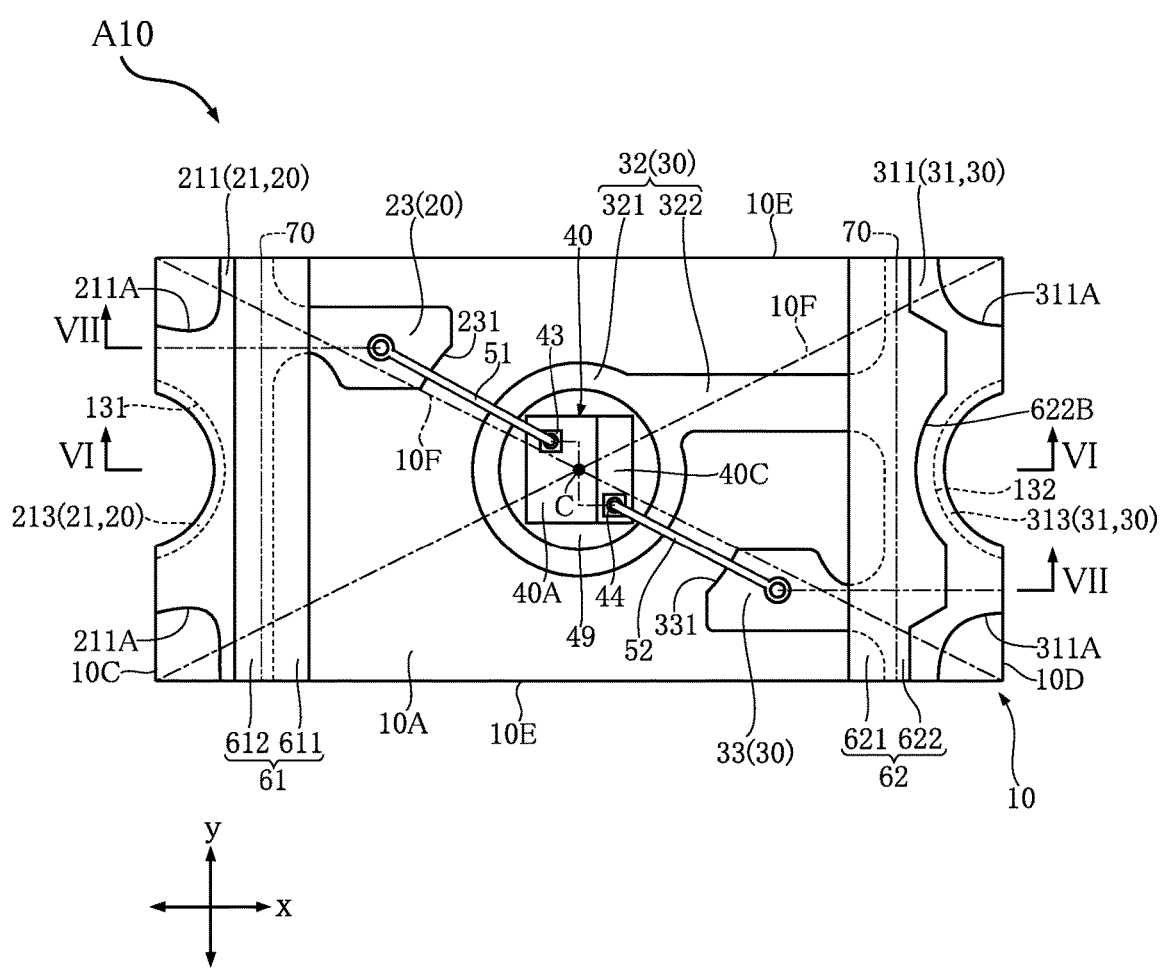
FIG. 2 is a plan view showing the LED package of FIG. 1 (with sealing resin shown transparent)

The LED package A10 includes a substrate 10, first wiring 20, second wiring 30, an LED chip 40, a first wire 51, a second wire 52, a first insulating layer 61, a second insulating layer 62, a polarity mark 69, and sealing resin 70. The LED package A10 is a surface-mounting type, in which the first wiring 20 and the second wiring 30 are formed on the substrate 10. In FIG. 2, the sealing resin 70 is shown transparent, and the outline of the sealing resin 70 is depicted by an imaginary line (two-dot chain line).

In the description of the LED package A10, the thickness direction of the substrate 10 may be referred to as the "thickness direction z". A direction perpendicular to the thickness direction z may be referred to as the "first direction x", which corresponds to the longitudinal direction of the LED package A10 as viewed in the thickness direction z. The direction perpendicular to both the thickness direction z and the first direction x may be referred to as the "second direction y", which corresponds to the lateral direction of the LED package A10 as viewed in the thickness direction z.

As shown in FIGS. 2, 4, 6, and 7, the first wiring 20, the second wiring 30, and the LED chip 40 are provided on the substrate 10. The substrate 10 is configured to have electrical insulation property. The substrate 10 may be made up of a plurality of glass cloths 11 laminated in the thickness direction z, and an impregnated resin 12 impregnated in the glass cloths 11. The glass cloths 11 are made of weaved glass fibers. In the example of the LED package A10, the impregnated resin 12 contains acrylic resin and bismaleimide-triazine (BT) resin. The acrylic resin may be polymethyl methacrylate resin. In the example of the LED package A10, the plurality of glass cloths 11 have a two-layer structure.

As shown in FIGS. 2 to 5, the substrate 10 has a front surface 10A, a back surface 10B, a first side surface 10C, a second side surface 10D, a pair of third side surfaces 10E, a first recess 131, and a second recess 132. The front surface 10A and the back surface 10B face opposite from each other in the thickness direction z. The front surface 10A is closer to the LED chip 40 than is the back surface 10B, and faces to the chip 40. The first side surface 10C faces a first side in the first direction x. The second side surface 10D faces a second side in the first direction x. The first side surface 10C and the second side surface 10D are connected to both the front surface 10A and the back surface 10B. The "first side in the first direction x" and the "second side in the first direction x" will be used in the following description as well. The third side surfaces 10E face oppositely in the second direction y and are separate from each other in the second direction y. The third side surfaces 10E are connected to both the front surface 10A and the back surface 10B.

Figure 6:
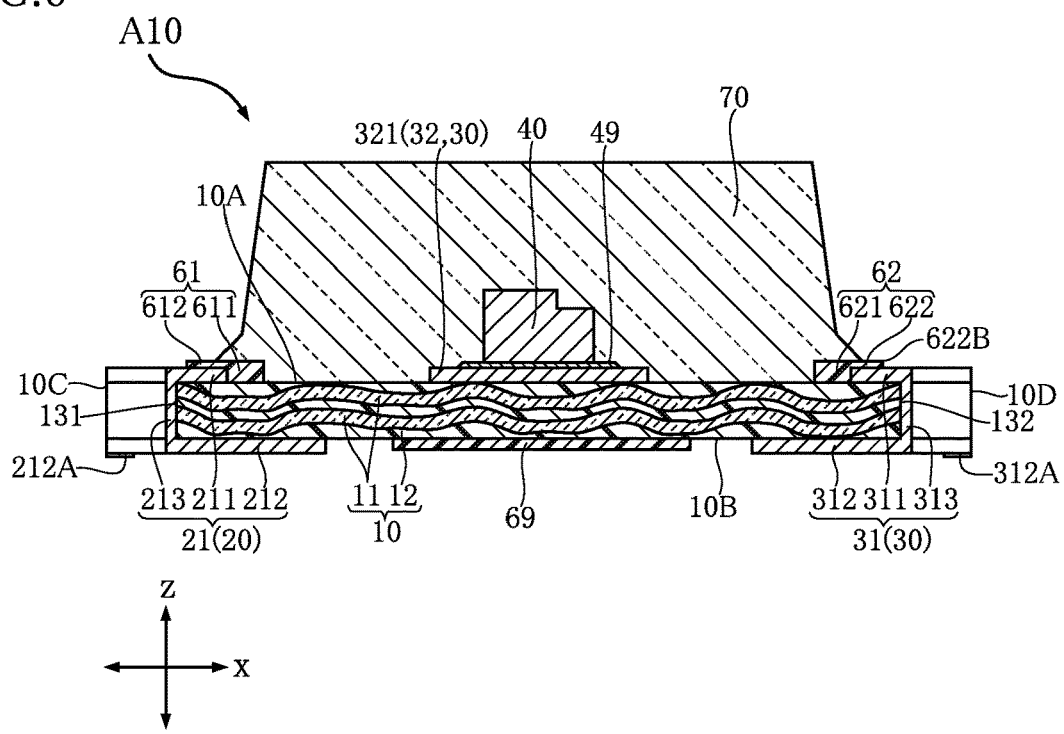
FIG. 6 is a cross-sectional view along line VI-VI in FIG. 2.

As shown in FIGS. 2 and 6, the first recess 131 is recessed from the first side surface 10C toward the inside of the substrate 10. The first recess 131 is substantially semi-circular as viewed in the thickness direction z. The first recess 131 extends from the front surface 10A to the back surface 10B. Accordingly, the first recess 131 passes through the substrate 10 in the thickness direction z.

As shown in FIGS. 2 and 6, the second recess 132 is recessed from the second side surface 10D toward the inside of the substrate 10. The second recess 132 is substantially semi-circular as viewed in the thickness direction z. The second recess 132 extends from the front surface 10A to the back surface 10B. Accordingly, the second recess 132 passes through the substrate 10 in the thickness direction z.

As shown in FIGS. 2 to 7, the first wiring 20 is formed in contact with the substrate 10. The first wiring 20 forms a part of a conductive path between the LED chip 40 and a wiring board on which the LED package A10 is to be mounted. The first wiring 20 may be formed with a plurality of metal layers. In the illustrated example, the plurality of metal layers are a copper (Cu) layer, a nickel (Ni) layer, and a gold (Au) layer that are laminated in order from the side closer to the substrate 10. Accordingly, the surface of the first wiring 20 is constituted of the gold layer. As shown in FIG. 2, the first wiring 20 includes a first terminal portion 21 and a first connecting portion 23.

As shown in FIG. 2, the substrate 10 has two end portions (left and right) spaced apart from each other in the first direction x. The first terminal portion 21 is arranged on one of the two end portions (left-side end portion in the illustrated example). As shown in FIGS. 2, 3, 5, and 6, the first terminal portion 21 includes a first front portion 211, a first back portion 212, and a first side portion 213.

Figure 4:
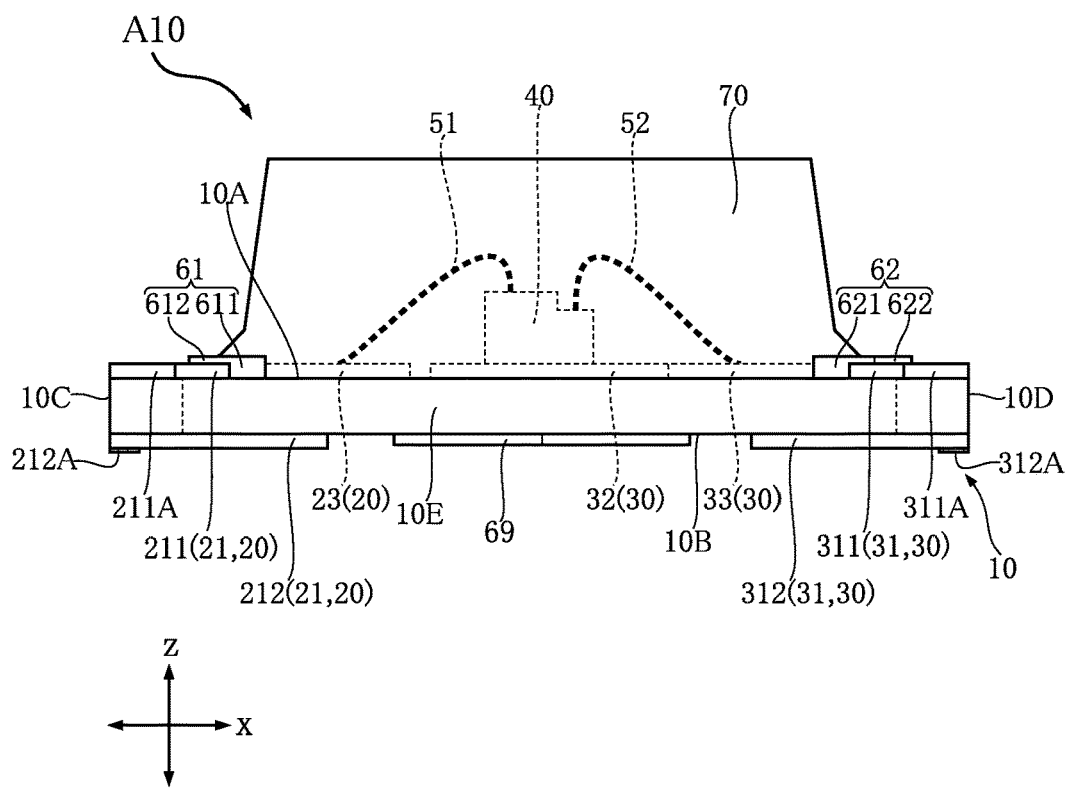
FIG. 4 is a front view showing the LED package of FIG. 1.
Figure 5:
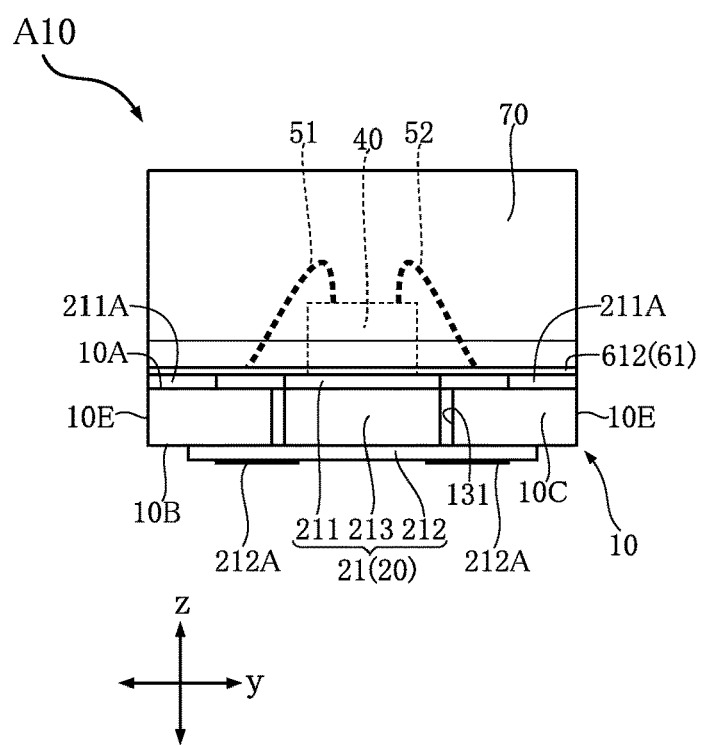
FIG. 5 is a left side view showing the LED package of FIG. 1.
Figure 7:
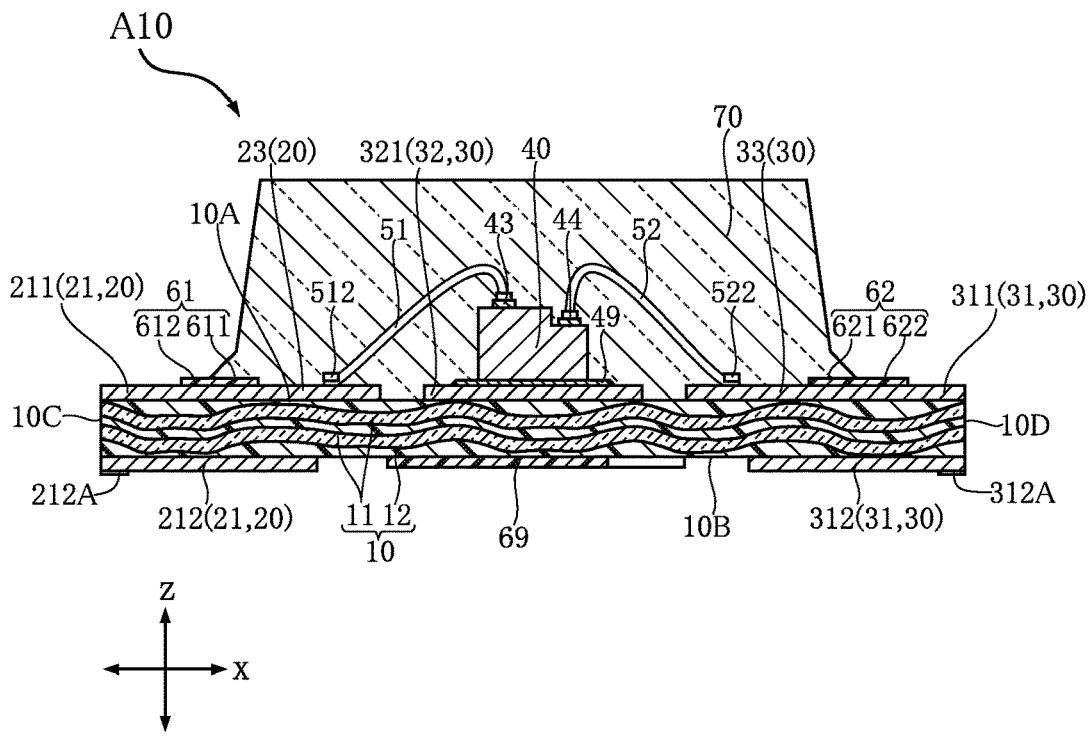
FIG. 7 is a cross-sectional view along line VII-VII in FIG. 2.

As shown in FIGS. 6 and 7, the first front portion 211 is in contact with the front surface 10A of the substrate 10. As shown in FIG. 2, the first front portion 211 extends up to both ends (or sides) of the front surface 10A spaced apart in the second direction y. As viewed in the thickness direction z, the first front portion 211 includes a portion formed along the periphery of the first recess 131 of the substrate 10. As shown in FIGS. 2, 4, and 5, the first front portion 211 is provided with a pair of first cutouts 211A. The pair of first cutouts 211A are positioned at both ends of the first front portion 211 in the second direction y. The pair of first cutouts 211A are recessed from a pair of corners of the front surface 10A toward the inside of the first front portion 211. The pair of corners are connected to the first side surface 10C of the substrate 10. The first cutouts 211A are substantially rectangular as viewed in the thickness direction z. A part of the front surface 10A is exposed from each of the first cutouts 211A.

Figure 3:
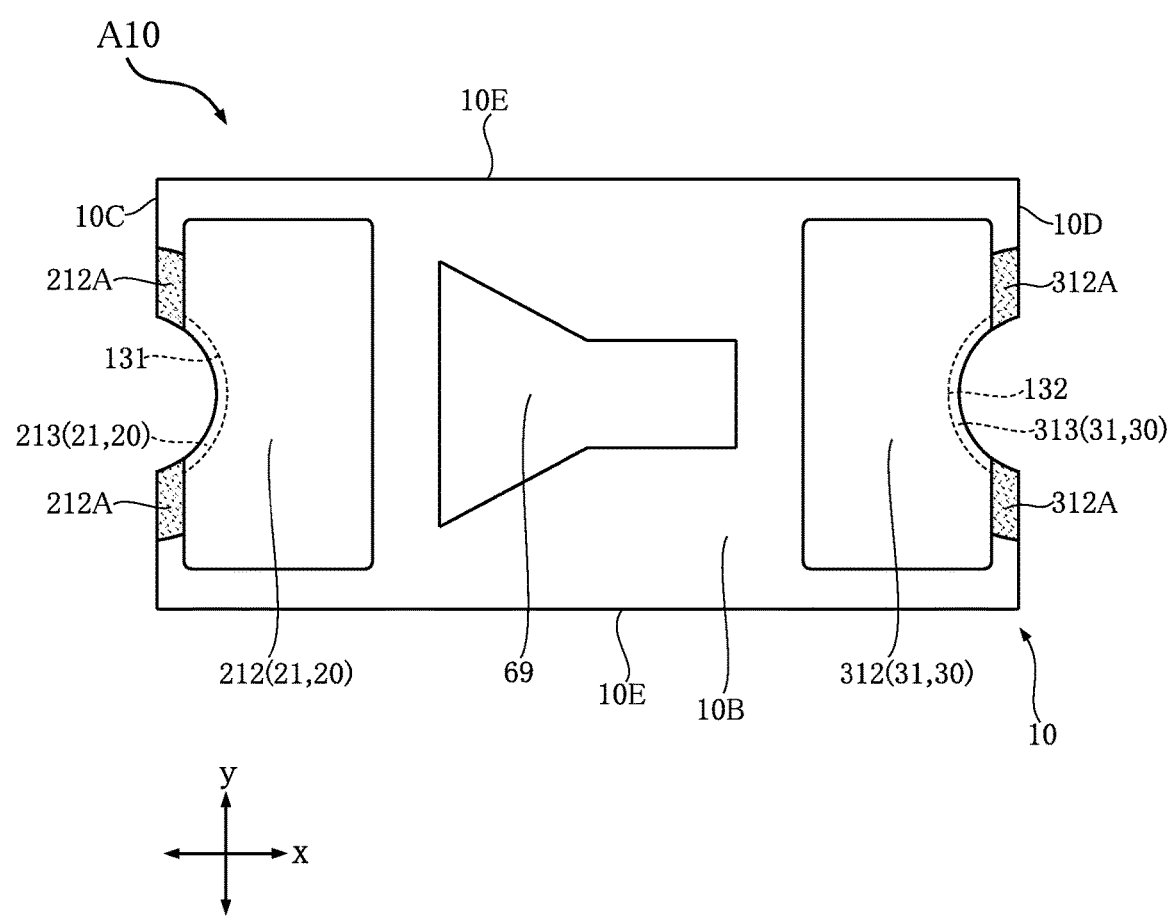
FIG. 3 is a bottom view showing the LED package of FIG. 1.
Figure 8:
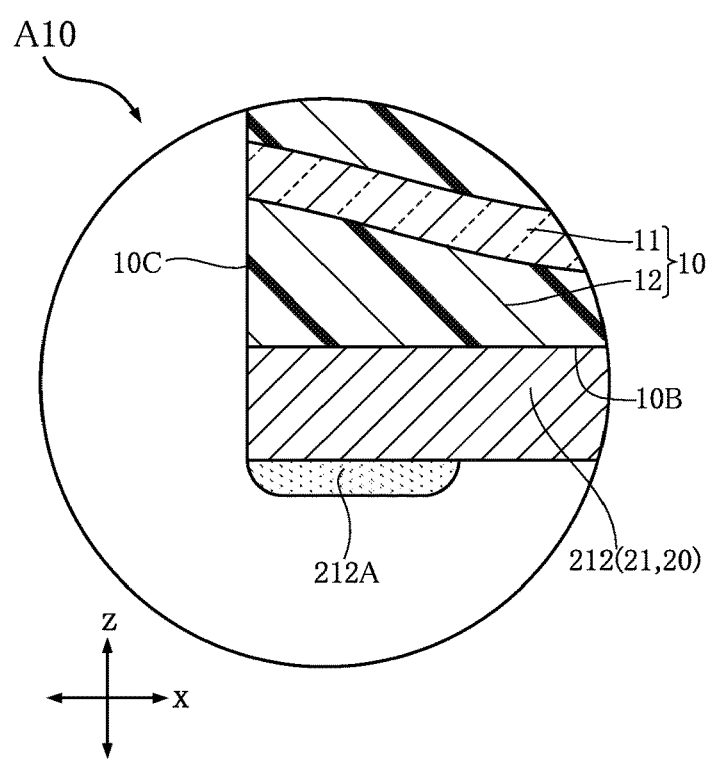
FIG. 8 is a partially enlarged view of FIG. 7 (near a first back portion of a first terminal portion of first wiring)

As shown in FIGS. 6 and 7, the first back portion 212 is in contact with the back surface 10B of the substrate 10. As shown in FIG. 3, both ends of the first back portion 212 in the second direction y are positioned more inward than the periphery of the back surface 10B, as viewed in the thickness direction z. Also, as viewed in the thickness direction z, the first back portion 212 includes a portion formed along the periphery of the first recess 131 of the substrate 10. As shown in FIGS. 3 to 7, the first back portion 212 is provided with a pair of first bumps 212A. As shown in FIGS. 3 and 8, the pair of first bumps 212A are adjacent to the boundary between the back surface 10B and the first side surface 10C of the substrate 10. The pair of first bumps 212A protrude toward the side in the thickness direction z which the back surface 10B faces.

As shown in FIG. 6, the first side portion 213 is in contact with the entirety of the first recess 131 of the substrate 10. In other words, the first recess 131 is covered with the first side portion 213. The first side portion 213 is connected to both the first front portion 211 and the first back portion 212.

As shown in FIG. 2, the first connecting portion 23 is arranged on the front surface 10A of the substrate 10. The first connecting portion 23 is connected to the first front portion 211 of the first terminal portion 21. The first connecting portion 23 electrically connects the first wiring 20 to the LED chip 40. The first connecting portion 23 has a first opposing edge 231. As viewed in the thickness direction z, the first opposing edge 231 faces the periphery of a pad portion 321 (details are described later) of a mounting portion 32 (second wiring 30). There is a gap between the first opposing edge 231 and the periphery of the pad portion 321.

As shown in FIGS. 2-4 and 6-7, the second wiring 30 is arranged on the substrate 10. The second wiring 30 is in contact with the substrate 10. Similarly to the first wiring 20, the second wiring 30 forms a part of the conductive path between the LED chip 40 and the wiring board on which the LED package A10 is to be mounted. The second wiring 30 may be formed with a plurality of metal layers. In the illustrated example, the plurality of metal layers are a copper layer, a nickel layer, and a gold layer that are laminated in order from the side closer to the substrate 10. Accordingly, the surface of the second wiring 30 is constituted of the gold layer. As shown in FIG. 2, the second wiring 30 includes a second terminal portion 31, the mounting portion 32, and a second connecting portion 33.

As shown in FIG. 2, the second terminal portion 31 is arranged on the right side of the substrate 10 in the first direction x. The second terminal portion 31 and the first terminal portion 21 are provided to allow the LED package A10 to be mounted on the wiring board. As shown in FIGS. 2, 3, and 6, the second terminal portion 31 includes a second front portion 311, a second back portion 312, and a second side portion 313.

As shown in FIGS. 6 and 7, the second front portion 311 is in contact with the front surface 10A of the substrate 10. As shown in FIG. 2, the second front portion 311 extends to both ends of the front surface 10A in the second direction y. As viewed in the thickness direction z, the second front portion 311 includes a portion formed along the periphery of the second recess 132 of the substrate 10. As shown in FIGS. 2 and 4, the second front portion 311 is provided with a pair of second cutouts 311A. The pair of second cutouts 311A are positioned at both ends of the second front portion 311 in the second direction y. The pair of second cutouts 311A are recessed from a pair of corners of the front surface 10A toward the inside of the second front portion 311. The pair of corners are connected to the second side surface 10D of the substrate 10. The second cutouts 311A are substantially quarter-circular as viewed in the thickness direction z. Accordingly, the second cutouts 311A differ in shape from the first cutouts 211A, as viewed in the thickness direction z. A part of the front surface 10A is exposed from each of the second cutouts 311A.

Figure 9:
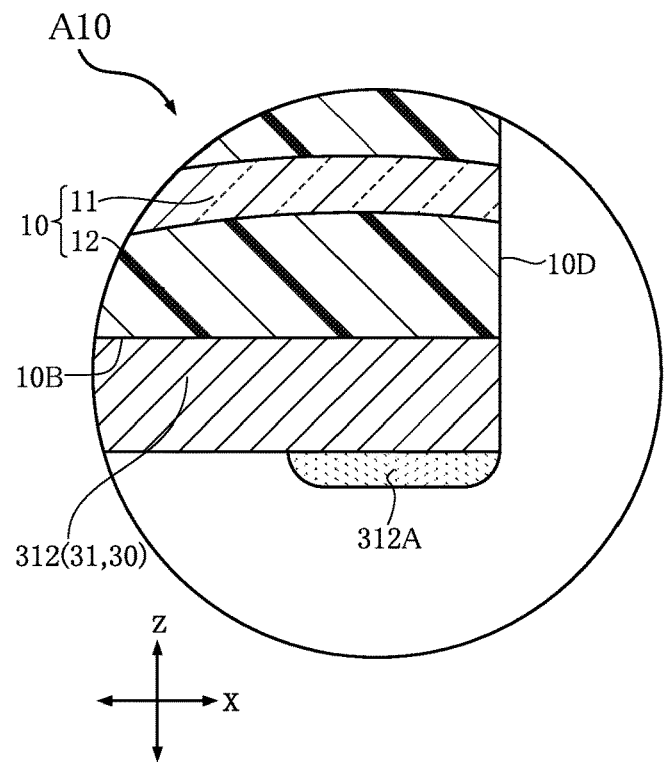
FIG. 9 is a partially enlarged view of FIG. 7 (near a second back portion of a second terminal portion of second wiring)

As shown in FIGS. 6 and 7, the second back portion 312 is in contact with the back surface 10B of the substrate 10. As shown in FIG. 3, both ends of the second back portion 312 in the second direction y are positioned more inward than the periphery of the back surface 10B, as viewed in the thickness direction z. Also, as viewed in the thickness direction z, the second back portion 312 includes a portion formed along the periphery of the second recess 132 of the substrate 10. As shown in FIGS. 3-4 and 6-7, the second back portion 312 is provided with a pair of second bumps 312A. As shown in FIGS. 3 and 9, the pair of second bumps 312A are adjacent to the boundary between the back surface 10B and the second side surface 10D of the substrate 10. The pair of second bumps 312A protrude toward the side in the thickness direction z which the back surface 10B faces.

As shown in FIG. 6, the second side portion 313 is in contact with the entirety of the second recess 132 of the substrate 10. Hence, the second recess 132 is covered with the second side portion 313. The second side portion 313 is connected to both the second front portion 311 and the second back portion 312.

As shown in FIG. 2, the mounting portion 32 is arranged on the front surface 10A of the substrate 10. The mounting portion 32 is connected to the second front portion 311 of the second terminal portion 31. The mounting portion 32 is provided to allow the LED chip 40 to be mounted on the second wiring 30. The mounting portion 32 includes the pad portion 321 and a coupling portion 322. The pad portion 321 has a substantially circular shape overlapping with the center C of the front surface 10A as viewed in the thickness direction z. The center C is the intersection of two diagonal lines F of the front surface 10A. The coupling portion 322 is connected to both the pad portion 321 and the second front portion 311. The coupling portion 322 has a band shape extending in the first direction x as viewed in the thickness direction z.

As shown in FIG. 2, the second connecting portion 33 is arranged on the front surface 10A of the substrate 10. The second connecting portion 33 is connected to the second front portion 311 of the second terminal portion 31. The second connecting portion 33 electrically connects the second wiring 30 to the LED chip 40. The second connecting portion 33 has a second opposing edge 331. As viewed in the thickness direction z, the second opposing edge 331 faces the periphery of the pad portion 321 of the mounting portion 32. There is a gap between the second opposing edge 331 and the pad portion 321.

As shown in FIG. 2, the first connecting portion 23 of the first wiring 20 and the second connecting portion 33 of the second wiring 30 overlap with a diagonal line 10F of the front surface 10A of the substrate 10, as viewed in the thickness direction z. As viewed in the thickness direction z, the center C of the front surface 10A is positioned between the first connecting portion 23 and the second connecting portion 33.

Figure 10:
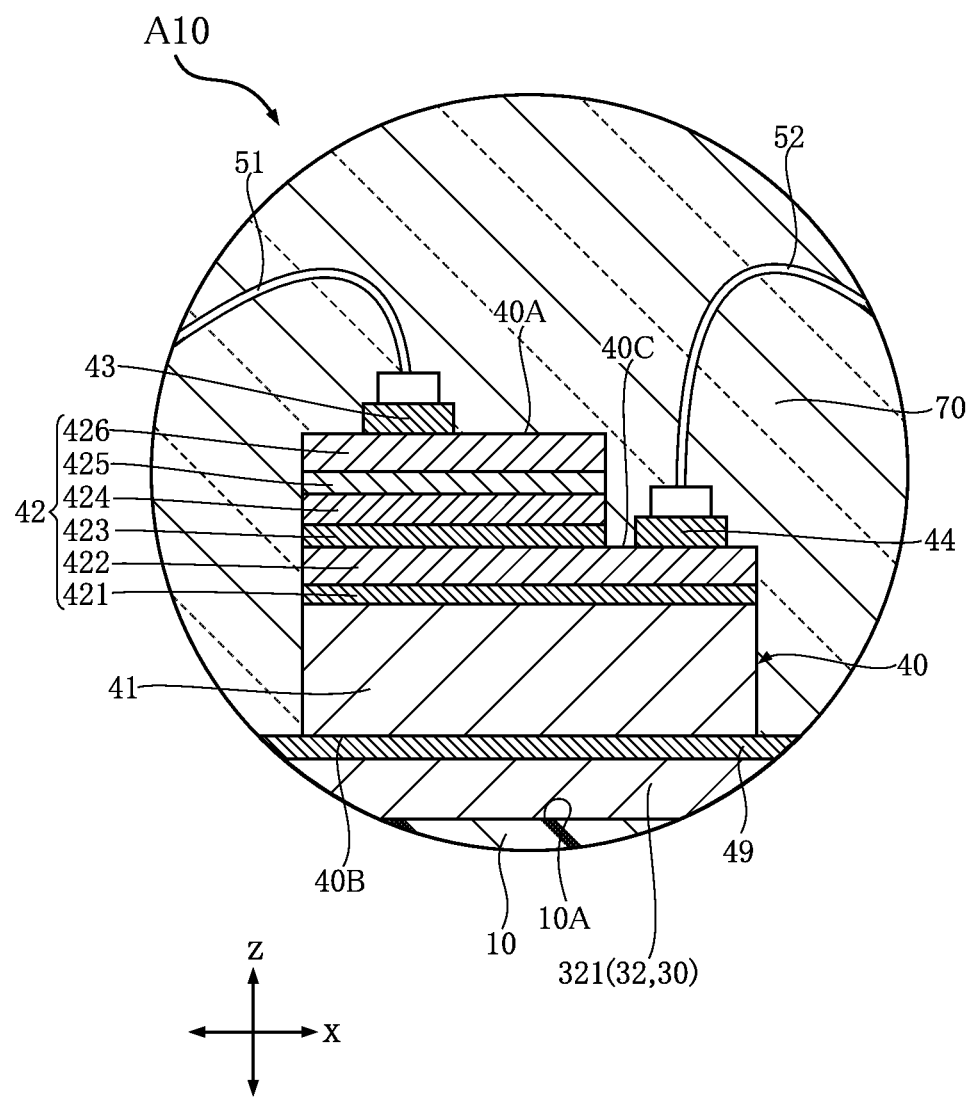
FIG. 10 is a partially enlarged view of FIG. 7 (around the LED chip)

As shown in FIGS. 2, 6, and 7, the LED chip 40 is mounted on the pad portion 321 of the mounting portion 32 of the second wiring 30. The LED chip 40 is rectangular as viewed in the thickness direction z. As shown in FIG. 10, the LED chip 40 includes a front surface 40A, a back surface 40B, a base 41, a plurality of semiconductor layers 42, a first electrode 43, and a second electrode 44. The front surface 40A faces the side in the thickness direction z which the front surface 10A of the substrate 10 faces. The back surface 40B faces the opposite side from the front surface 40A. Accordingly, the back surface 40B faces the pad portion 321 in the thickness direction z.

As shown in FIG. 10, the base 41 supports the plurality of semiconductor layers 42, the first electrode 43, and the second electrode 44. The base 41 has electrical insulation property. The base 41 is made of sapphire, for example. A surface of the base 41, which faces the pad portion 321 of the mounting portion 32 in the thickness direction z, constitutes the back surface 40B.

As shown in FIG. 10, the plurality of semiconductor layers 42 are laminated on the base 41 in the thickness direction z. The semiconductor layers 42 include a first buffer layer 421, an n-type semiconductor layer 422, a second buffer layer 423, a light-emitting layer 424, a first p-type semiconductor layer 425, and a second p-type semiconductor layer 426. Each of these semiconductor layers 42 is made of a group III nitride semiconductor material.

The first buffer layer 421 is laminated in contact with the base 41. For example, the first buffer layer 421 is made of a gallium nitride (GaN) layer not containing a dopant.

The n-type semiconductor layer 422 is laminated in contact with the first buffer layer 421. For example, the n-type semiconductor layer 422 is made of a gallium nitride layer containing an n-type dopant. The n-type dopant may be silicon (Si), for example.

The second buffer layer 423 is laminated in contact with the n-type semiconductor layer 422. The second buffer layer 423 may include a lamination of semiconductor layers. Each of the semiconductor layers is formed by laminating a gallium nitride layer on an indium gallium nitride (InGaN) layer. Each of the semiconductor layers contains silicon as an n-type dopant.

The light-emitting layer 424 is laminated in contact with the second buffer layer 423. The light-emitting layer 424 emits light when a predetermined voltage is applied to the LED chip 40. The light-emitting layer 424 may include a lamination of semiconductor layers. Each of the semiconductor layers is formed by laminating a gallium nitride layer, which contains an n-type dopant, on an indium gallium nitride layer. The n-type dopant may be silicon, for example.

The first p-type semiconductor layer 425 is laminated in contact with the light-emitting layer 424. The first p-type semiconductor layer 425 may be made of an aluminum gallium nitride (AlGaN) layer containing a p-type dopant. The p-type dopant may be magnesium (Mg).

The second p-type semiconductor layer 426 is laminated in contact with the first p-type semiconductor layer 425. The second p-type semiconductor layer 426 may be made of a gallium nitride layer containing a p-type dopant. The p-type dopant may be magnesium (Mg). The concentration of the p-type dopant in the second p-type semiconductor layer 426 is larger than that of the p-type dopant in the first p-type semiconductor layer 425. A surface of the second p-type semiconductor layer 426, which faces the side in the thickness direction z that the front surface 10A of the substrate 10 faces, constitutes the front surface 40A.

As viewed in the thickness direction z, the area of each of the first buffer layer 421 and the n-type semiconductor layer 422 is equal to the area of the base 41. Also, as viewed in the thickness direction z, the area of each of the second buffer layer 423, the light-emitting layer 424, the first p-type semiconductor layer 425, and the second p-type semiconductor layer 426 is smaller than the area of the base 41. This is because the LED chip 40 is formed with a dent 40C, as shown in FIGS. 2 and 10. The dent 40C is dented from the front surface 40A in the thickness direction z, and reaches the upper surface of the n-type semiconductor layer 422. The dent 40C is rectangular as viewed in the thickness direction z. The dent 40C is connected to three side surfaces of the LED chip 40.

As shown in FIG. 10, the first electrode 43 is in contact with the front surface 40A. The first electrode 43 may be formed of a metal layer in which a gold layer is laminated on a titanium (Ti) layer. The first electrode 43 is an anode (positive electrode) of the LED chip 40.

As shown in FIG. 10, the second electrode 44 is in contact with the upper surface of the n-type semiconductor layer 422 that forms the dent 40C. The second electrode 44 may be formed of a metal layer in which a gold layer is laminated on a titanium layer. The second electrode 44 is a cathode (negative electrode) of the LED chip 40.

As shown in FIGS. 2, 6, 7, and 10, the LED chip 40 is mounted on the pad portion 321 of the mounting portion 32 of the second wiring 30 via a bonding layer 49. The bonding layer 49 is interposed between the pad portion 321 and the back surface 10B. The bonding layer 49 may be a synthetic resin paste chiefly containing silicone.

As shown in FIG. 2, the first wire 51 is connected to the first electrode 43 of the LED chip 40 and the first connecting portion 23 of the first wiring 20. In this way, the LED chip 40 is electrically connected to the first wiring 20. The first wire 51 may be made of gold. The first wire 51 is formed by wire bonding.

Figure 11:
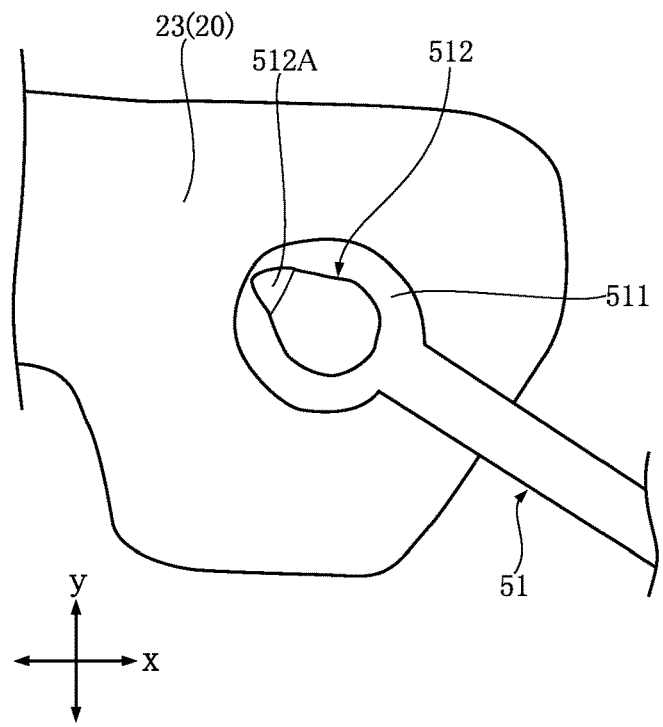
FIG. 11 is a partially enlarged view of FIG. 2 (around a first connecting portion of the first wiring)

As shown in FIG. 11, the first wire 51 has an end 511 connected to the first connecting portion 23 of the first wiring 20. The end 511 is circular as viewed in the thickness direction z. The end 511 is provided thereon with a connector 512. As shown in FIGS. 7 and 11, the connector 512 has a columnar shape. The connector 512 is formed by connecting the first wire 51 to the first connecting portion 23 by wire bonding, and performing ball bonding on a portion of the first wire 51 that is in contact with the first connecting portion 23. The connector 512 has a tongue 512A. As viewed in the thickness direction z, the tongue 512A protrudes away from the LED chip 40 in the direction in which the first wire 51 extends (see FIG. 2).

As shown in FIG. 2, the second wire 52 is connected to the second electrode 44 of the LED chip 40 and the second connecting portion 33 of the second wiring 30. In this way, the LED chip 40 is electrically connected to the second wiring 30. The second wire 52 may be made of gold. The second wire 52 is formed by wire bonding.

Figure 12:
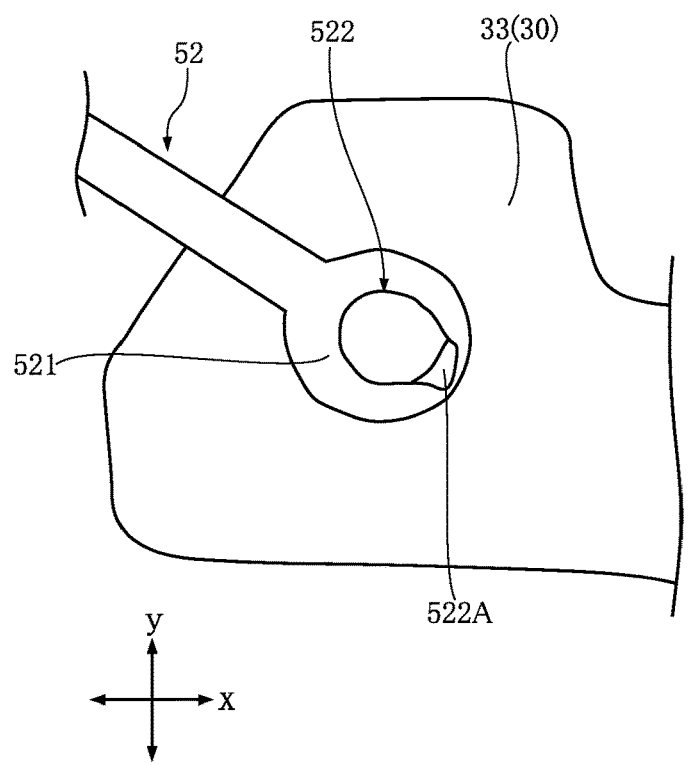
FIG. 12 is a partially enlarged view of FIG. 2 (around a second connecting portion of the second wiring)

As shown in FIG. 12, the second wire 52 has an end 521 connected to the second connecting portion 33 of the second wiring 30. The end 521 is circular as viewed in the thickness direction z. The end 521 is provided thereon with a connector 522. As shown in FIGS. 7 and 12, the connector 522 has a columnar shape. The connector 522 is formed by connecting the second wire 52 to the second connecting portion 33 by wire bonding, and performing ball bonding on a portion of the second wire 52 that is in contact with the second connecting portion 33. The connector 522 has a tongue 522A. As viewed in the thickness direction z, the tongue 522A protrudes away from the LED chip 40 in the direction in which the second wire 52 extends (see FIG. 2).

As shown in FIGS. 1, 2, 4, 6, and 7, the first insulating layer 61 covers at least a portion of the first front portion 211 of the first terminal portion 21 of the first wiring 20. In the example of the LED package A10, the first insulating layer 61 covers a portion of the first connecting portion 23 of the first wiring 20. The first insulating layer 61 extends to both ends of the front surface 10A of the substrate 10 in the second direction y. The first insulating layer 61 has an electrical insulation property. The first insulating layer 61 is formed of a resist film.

As shown in FIGS. 1, 2, 4, 6, and 7, the first insulating layer 61 has a first intervening portion 611 and a first exposed portion 612. The first intervening portion 611 is positioned between the front surface 10A of the substrate 10 and the sealing resin 70 in the thickness direction z. The first intervening portion 611 is covered with the sealing resin 70 except for a pair of end surfaces facing in the second direction y. The first exposed portion 612 is connected to the first intervening portion 611 on the first side in the first direction x. The first exposed portion 612 is exposed from the sealing resin 70. The first exposed portion 612 has a band shape extending in the second direction y as viewed in the thickness direction z.

Figure 13:
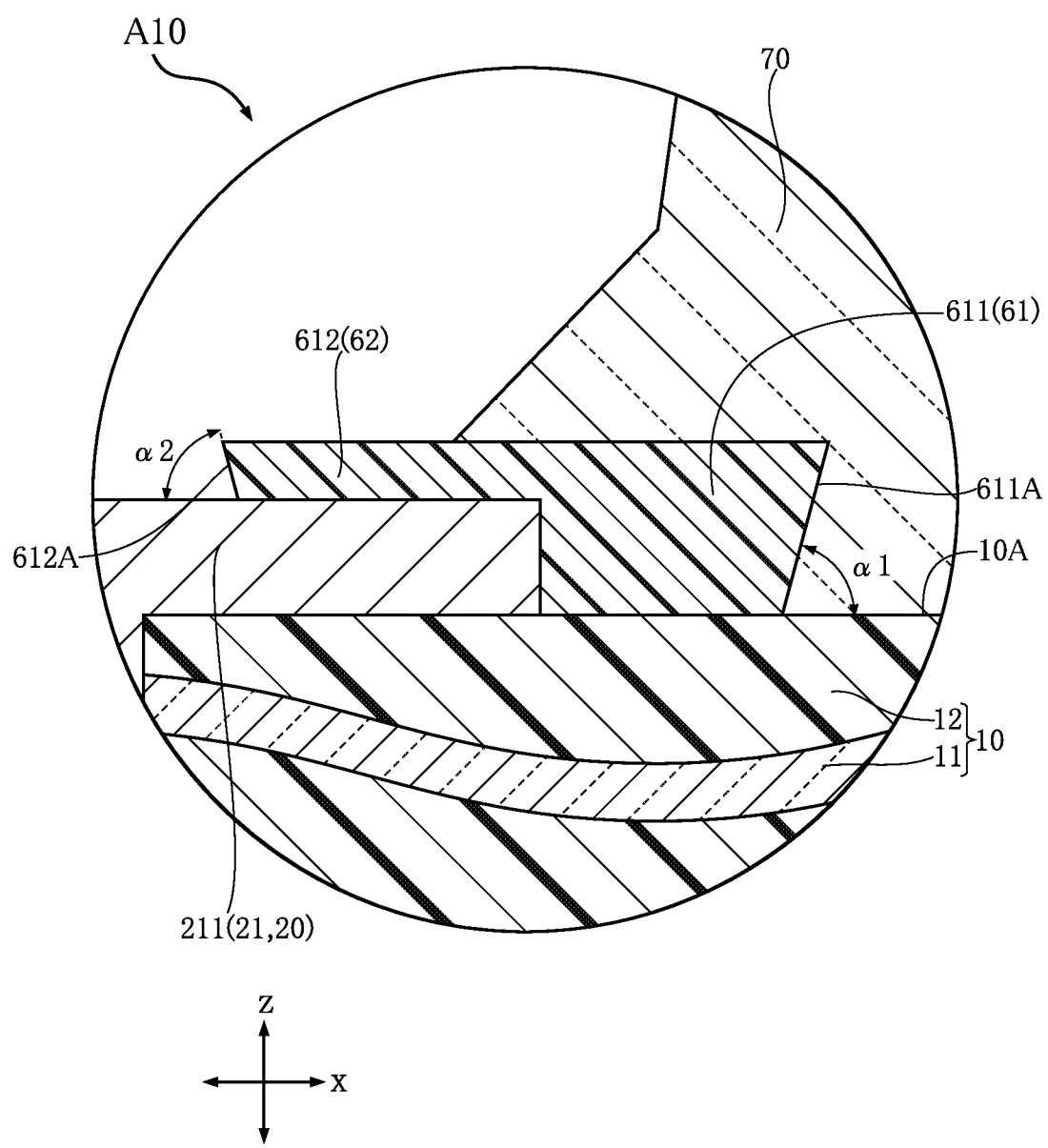
FIG. 13 is a partially enlarged view of FIG. 6 (around a first insulating layer)

As shown in FIG. 13, the first intervening portion 611 has an inclined surface 611A. The inclined surface 611A is inclined to the front surface 10A of the substrate 10 at an inclination angle α1. The inclination angle α1 is acute. Accordingly, the cross-sectional area of the first intervening portion 611 with respect to the thickness direction z increases with distance from the front surface 10A.

As shown in FIG. 13, the first exposed portion 612 has an inclined surface 612A. The inclined surface 612A is inclined to the front surface 10A of the substrate 10 at an inclination angle α2. The inclination angle α2 is acute. Accordingly, the cross-sectional area of the first exposed portion 612 with respect to the thickness direction z increases with distance from the front surface 10A.

As shown in FIGS. 1, 2, 4, 6, and 7, the second insulating layer 62 covers at least a portion of the second front portion 311 of the second terminal portion 31 of the second wiring 30. In the example of the LED package A10, the second insulating layer 62 covers a portion of the coupling portion 322 of the mounting portion 32 of the second wiring 30, and a portion of the second connecting portion 33 of the second wiring 30. The second insulating layer 62 extends to both ends of the front surface 10A of the substrate 10 in the second direction y. The second insulating layer 62 has an electrical insulation property. The second insulating layer 62 is formed of a resist film.

As shown in FIGS. 1, 2, 4, 6, and 7, the second insulating layer 62 has a second intervening portion 621 and a second exposed portion 622. The second intervening portion 621 is positioned between the front surface 10A of the substrate 10 and the sealing resin 70 in the thickness direction z. The second intervening portion 621 is covered with the sealing resin 70 except for a pair of end surfaces facing in the second direction y. The second exposed portion 622 is connected to the second intervening portion 621 on the second side in the first direction x. The second exposed portion 622 is exposed from the sealing resin 70. As shown in FIG. 2, the second exposed portion 622 has a curved edge 622B along the periphery of the second recess 132 of the substrate 10 as viewed in the thickness direction z. Accordingly, as viewed in the thickness direction z, the second exposed portion 622 has a different shape from the first exposed portion 612 of the first insulating layer 61.

Figure 14:
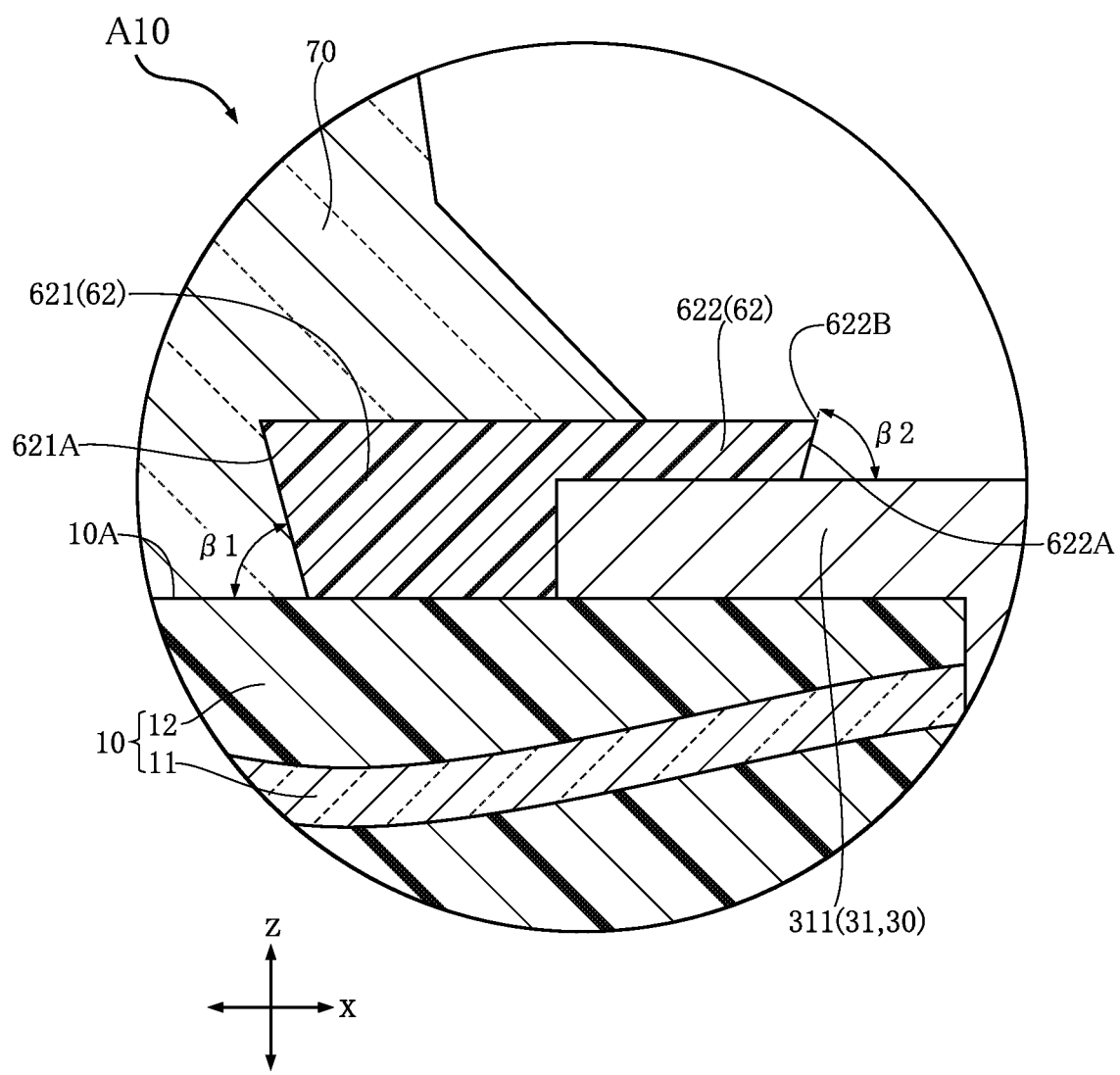
FIG. 14 is a partially enlarged view of FIG. 6 (around a second insulating layer)

As shown in FIG. 14, the second intervening portion 621 has an inclined surface 621A. The inclined surface 621A is inclined to the front surface 10A of the substrate 10 at an inclination angle β1. The inclination angle β1 is acute. Accordingly, the cross-sectional area of the second intervening portion 621 with respect to the thickness direction z increases with distance from the front surface 10A.

As shown in FIG. 14, the second exposed portion 622 has an inclined surface 622A. The inclined surface 622A is inclined to the front surface 10A of the substrate 10 at an inclination angle β2. The inclination angle β2 is acute. Accordingly, the cross-sectional area of the second exposed portion 622 with respect to the thickness direction z increases with distance from the front surface 10A.

As shown in FIG. 3, the polarity mark 69 is arranged on the back surface 10B of the substrate 10. The polarity mark 69 is positioned between the first back portion 212 of the first terminal portion 21 of the first wiring 20 and the second back portion 312 of the second terminal portion 31 of the second wiring 30 in the first direction x. The polarity mark 69 indicates the anode of the LED package A10. In the example of the LED package A10, the triangular portion of the polarity mark 69 indicates the anode. Accordingly, the polarity mark 69 indicates that the first back portion 212 is an anode. The polarity mark 69 may be made of a resist film.

As shown in FIG. 1 and FIGS. 4 to 7, the sealing resin 70 is supported by the substrate 10, and covers the LED chip 40, the first wire 51, and the second wire 52. The sealing resin 70 further covers the respective portions of the front surface 10A of the substrate 10, the first wiring 20, the second wiring 30, the first insulating layer 61, and the second insulating layer 62. The sealing resin 70 is made of an epoxy resin that contains silicone and has translucency. The silicone may contain a plurality of microparticles. The main component of the epoxy resin may be an alicyclic epoxy resin (cycloaliphatic epoxy resin) which does not contain any benzene rings. Note that the sealing resin 70 may contain a plurality of phosphors (not shown). For example, if the LED chip 40 emits blue light, the sealing resin 70 may contain a plurality of yellow phosphors so that the LED package A10 emits white light. A pair of end surfaces of the sealing resin 70 facing in the second direction y are flush with the pair of third side surfaces 10E of the substrate 10.

The following describes advantages of the LED package A10.

The LED package A10 includes the substrate 10 on which the first wiring 20 and the second wiring 30 are arranged and on which the LED chip 40 is mounted, and also includes the sealing resin 70 covering the LED chip 40. The substrate 10 includes glass cloths 11 laminated in the thickness direction z, and the impregnated resin 12 impregnated in the glass cloths 11. The impregnated resin 12 contains acrylic resin. The sealing resin 70 contains silicone. This improves the durability of the substrate 10 and the sealing resin 70 to the light emitted from the LED chip 40, thus stabilizing the amount of luminous flux emitted from the LED package A10 over a long period of time. Furthermore, the plurality of glass cloths 11 in the substrate 10 can prevent lowering of the bending strength and the shear strength of the substrate 10 even if the thickness of the substrate 10 is made smaller. As such, the LED package A10 can realize size reduction while stabilizing the amount of emitted luminous flux over a long period of time.

Figure 15:
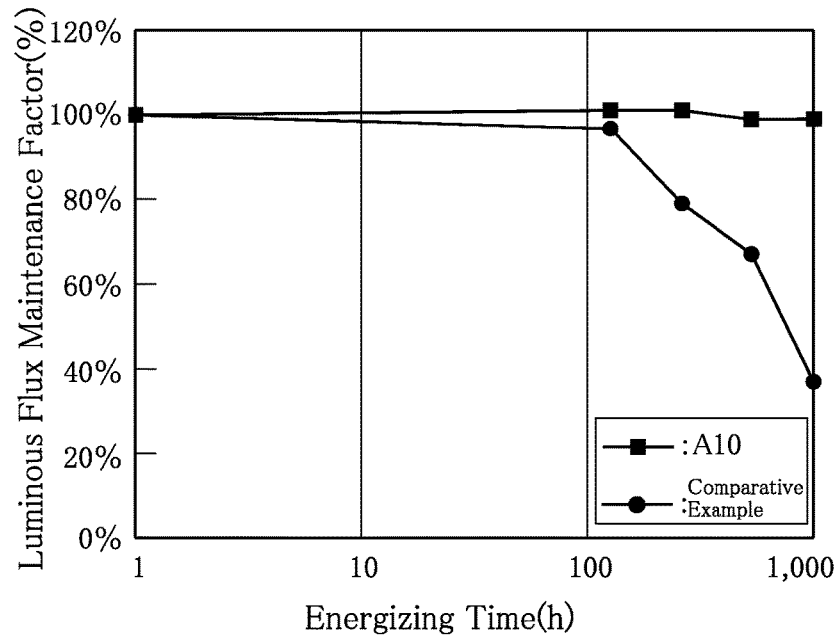
FIG. 15 shows the results of a test regarding a luminous flux maintenance factor relative to energizing time, where the test was performed on the LED package of FIG. 1 and the LED package of a comparative example.

FIG. 15 shows the results of a test regarding a luminous flux maintenance factor relative to energizing time, where the test was performed on the LED package A10 and the LED package of a comparative example. The substrate 10 of the LED package in the comparative example contains bismaleimide-triazine resin. The sealing resin 70 of the LED package in the comparative example has the same structure as the sealing resin 70 of the LED package A10. The test conditions are such that the ambient temperature (Ta) is 80° C. and the forward current (IF) is 20 mA. As shown in FIG. 15, the LED package A10 maintains the luminous flux maintenance factor at almost 100% even after the energizing time has reached 1000 hrs. On the other hand, in the LED package of the comparative example, the luminous flux maintenance factor gradually decreases with an increase in the energizing time, and becomes 37% when the energizing time reaches 1000 hrs. This confirms that the LED package A10 stabilizes the amount of emitted luminous flux over a long period of time.

The LED package A10 further includes the first insulating layer 61 and the second insulating layer 62. The first insulating layer 61 and the second insulating layer 62 extend to both ends of the front surface 10A of the substrate 10 in the second direction y. The first insulating layer 61 includes the first intervening portion 611 and the first exposed portion 612. The first intervening portion 611 is positioned between the front surface 10A of the substrate 10 and the sealing resin 70 in the thickness direction z. The first exposed portion 612 is connected to the first intervening portion 611 and exposed from the sealing resin 70. The second insulating layer 62 includes the second intervening portion 621 and the second exposed portion 622. The second intervening portion 621 is positioned between the front surface 10A and the sealing resin 70 in the thickness direction z. The second exposed portion 622 is connected to the second intervening portion 621 and exposed from the sealing resin 70. In this way, when the sealing resin 70 is formed by transfer molding, the mold presses down the first exposed portion 612 and the second exposed portion 622, so that the first intervening portion 611 and the second intervening portion 621 can fill the space between the front surface 10A and the sealing resin 70. This improves the bonding strength of the sealing resin 70 with respect to the substrate 10, the first insulating layer 61, and the second insulating layer 62. Furthermore, this reliably prevents solder from flowing onto the front surface 10A covered with the sealing resin 70, when the LED package A10 is mounted.

As viewed in the thickness direction z, the second exposed portion 622 of the second insulating layer 62 has a different shape from the first exposed portion 612 of the first insulating layer 61. In this way, even after the LED package A10 is mounted on the wiring board, the anode of the LED package A10 is recognizable from outside. In order to make the first exposed portion 612 and the second exposed portion 622 different in shape, the first insulating layer 61 and the second insulating layer 62 may be made of a resist film.

The first front portion 211 of the first terminal portion 21 of the first wiring 20 is formed with the pair of first cutouts 211A. The pair of first cutouts 211A are positioned at both ends in the second direction y and recessed, from the pair of corners of the front surface 10A that are connected to the first side surface 10C of the substrate 10, toward the inside of the first front portion 211. The front surface 10A is exposed from the pair of first cutouts 211A. This makes it possible to reduce the areas of a plurality of end surfaces of the first front portion 211 that are flush with the first side surface 10C and the pair of third side surfaces 10E of the substrate 10. This helps in suppressing the generation of metal burrs caused by cutting the first wiring 20 during the manufacturing process of the LED package A10.

The second front portion 311 of the second terminal portion 31 of the second wiring 30 is formed with the pair of second cutouts 311A. The pair of second cutouts 311A are recessed from the pair of corners of the front surface 10A that are positioned at both ends in the second direction y, and that are connected to the second side surface 10D of the substrate 10. The pair of second cutouts 311A are recessed toward the inside of the second front portion 311. The front surface 10A is exposed from the pair of second cutouts 311A. This makes it possible to reduce the areas of a plurality of end surfaces of the second front portion 311 that are flush with the second side surface 10D and the pair of third side surfaces 10E of the substrate 10. This helps in suppressing the generation of metal burrs caused by cutting the second wiring 30 during the manufacturing process of the LED package A10.

As viewed in the thickness direction z, the pair of first cutouts 211A of the first front portion 211 (the first terminal portion 21 of the first wiring 20) differ in shape from the pair of second cutouts 311A of the second front portion 311 (the second terminal portion 31 of the second wiring 30). In this way, even after the LED package A10 is mounted on the wiring board, the anode of the LED package A10 is recognizable from outside.

The first back portion 212 of the first terminal portion 21 of the first wiring 20 is provided with the first bumps 212A. The first bumps 212A are adjacent to the boundary between the back surface 10B and the first side surface 10C of the substrate 10, and protrude in the thickness direction z. This allows the first back portion 212 to have an anchoring effect on solder when the LED package A10 is mounted on the wiring board, thus improving the mounting strength of the LED package A10 with respect to the wiring board.

The second back portion 312 of the second terminal portion 31 of the second wiring 30 is provided with the second bumps 312A. The second bumps 312A are adjacent to the boundary between the back surface 10B and the second side surface 10D of the substrate 10, and protrude in the thickness direction z. This allows the second back portion 312 to have an anchoring effect on solder when the LED package A10 is mounted on the wiring board, thus improving the mounting strength of the LED package A10 with respect to the wiring board.

The LED package A10 further includes the first wire 51 and the second wire 52. The columnar connector 512 is provided on the end 511 of the first wire 51 that is connected to the first connecting portion 23 of the first wiring 20, and the columnar connector 522 is provided on the end 521 of the second wire 52 that is connected to the second connecting portion 33 of the second wiring 30. Such a structure can prevent the end 511 of the first wire 51 from peeling off from the first connecting portion 23. It can also prevent the end 521 of the second wire 52 from peeling off from the second connecting portion 33.

Next, descriptions are provided of an LED package A20 according to a second embodiment of the present disclosure and an LED display device B10 according to the first embodiment of the present disclosure, with reference to FIGS. 16 to 22. In these figures, elements that are the same as or similar to the elements of the LED package A10 described above are provided with the same reference signs, and descriptions thereof are omitted.

Figure 16:
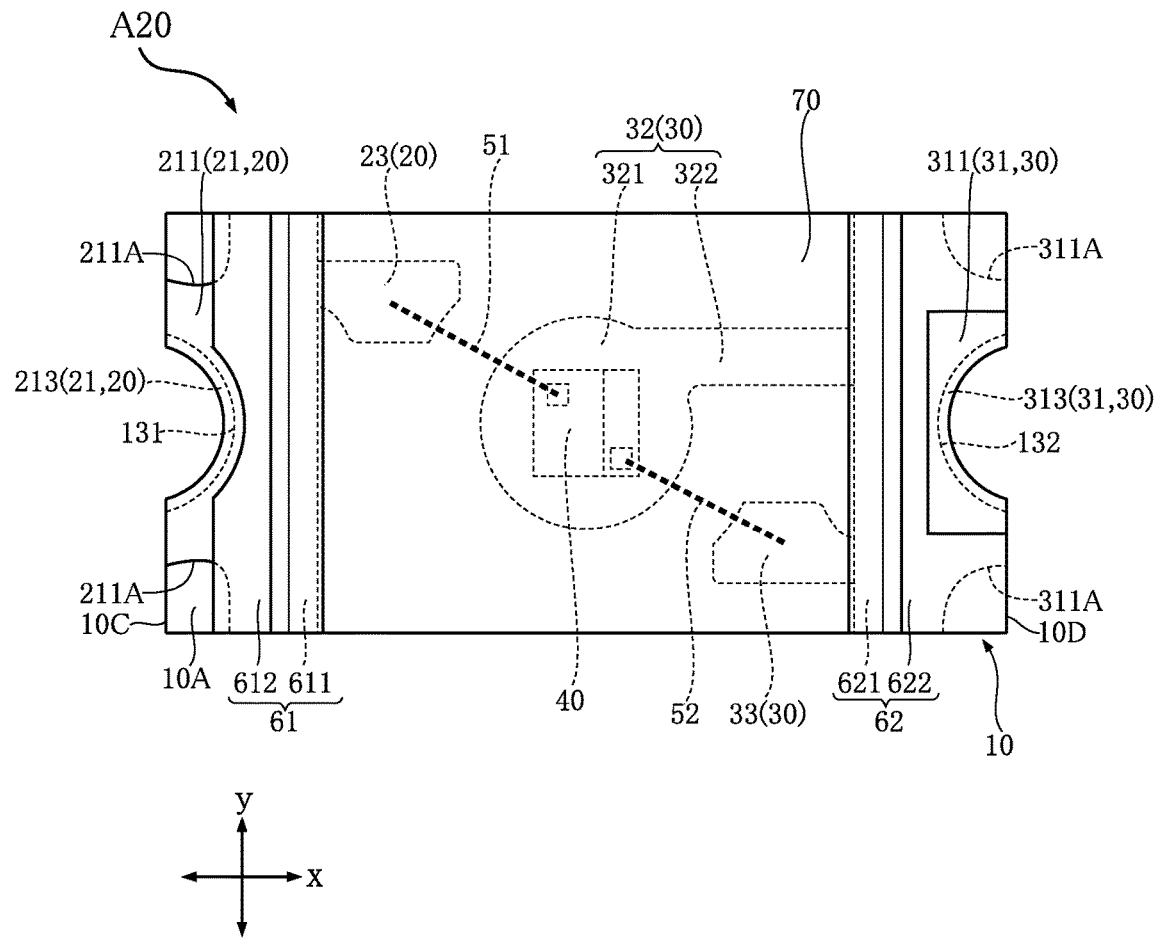
FIG. 16 is a plan view showing an LED package according to a second embodiment of the present disclosure.
Figure 17:
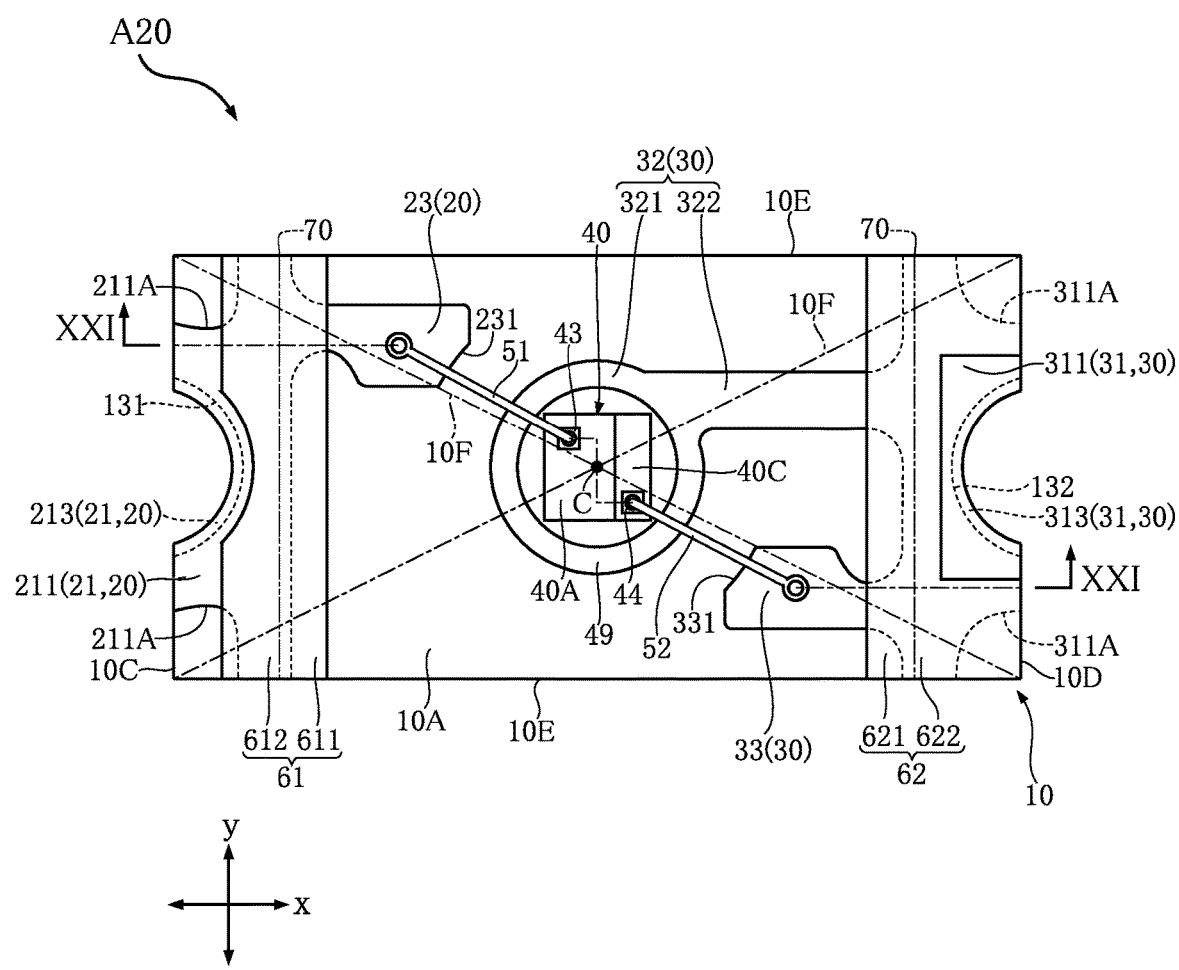
FIG. 17 is a plan view showing the LED package of FIG. 16 (with sealing resin shown transparent)

The following describes the LED package A20 with reference to FIGS. 16 to 21. The LED package A20 differs from the LED package A10 in the structures of the substrate 10, the first insulating layer 61, the second insulating layer 62, and the polarity mark 69. Note that a sealing resin 70 of the LED package A20 has the same configuration as that of the LED package A10. FIG. 17 omits the sealing resin 70, whose outline is depicted by an imaginary line.

Figure 19:
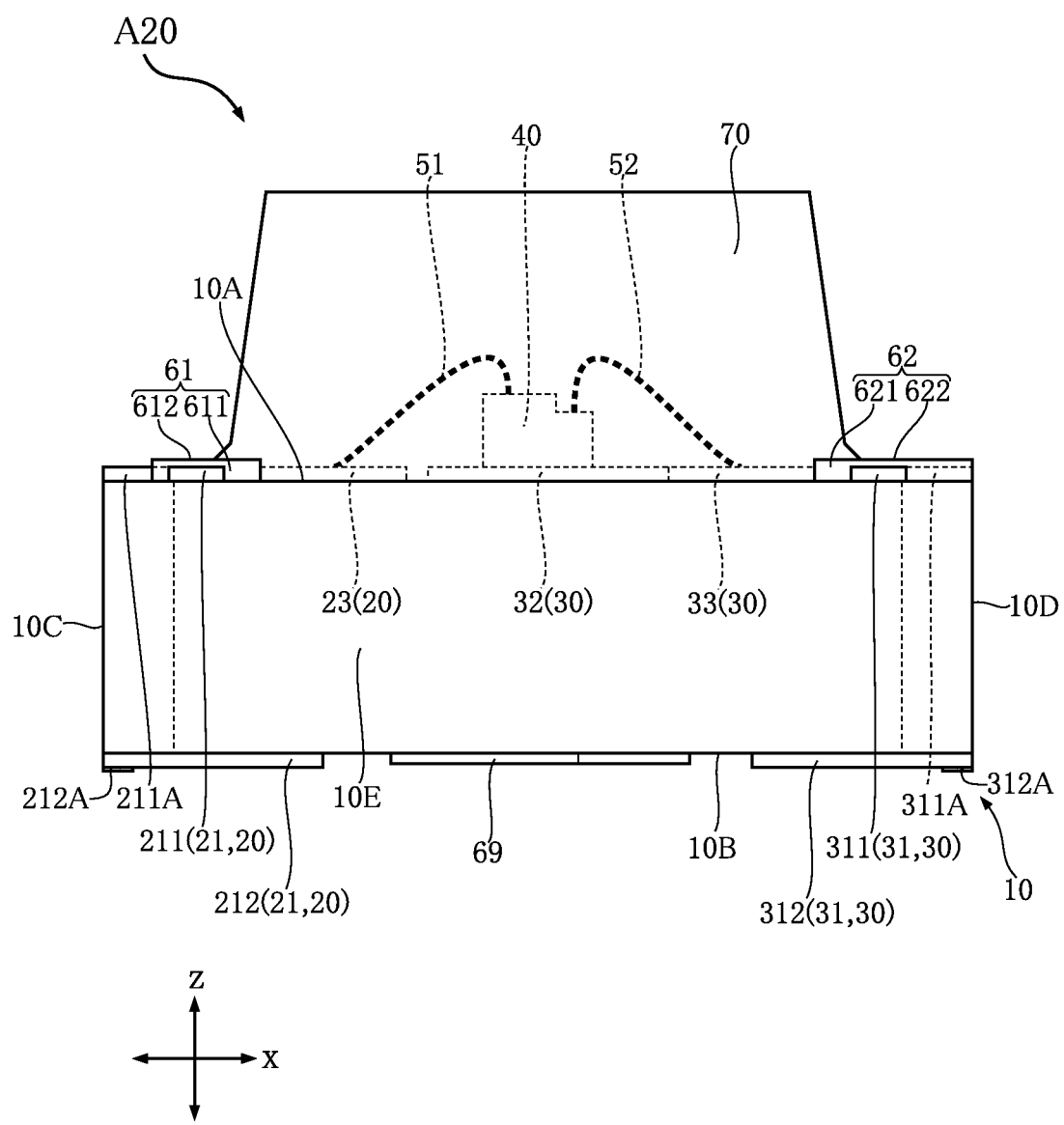
FIG. 19 is a front view showing the LED package of FIG. 16.
Figure 20:
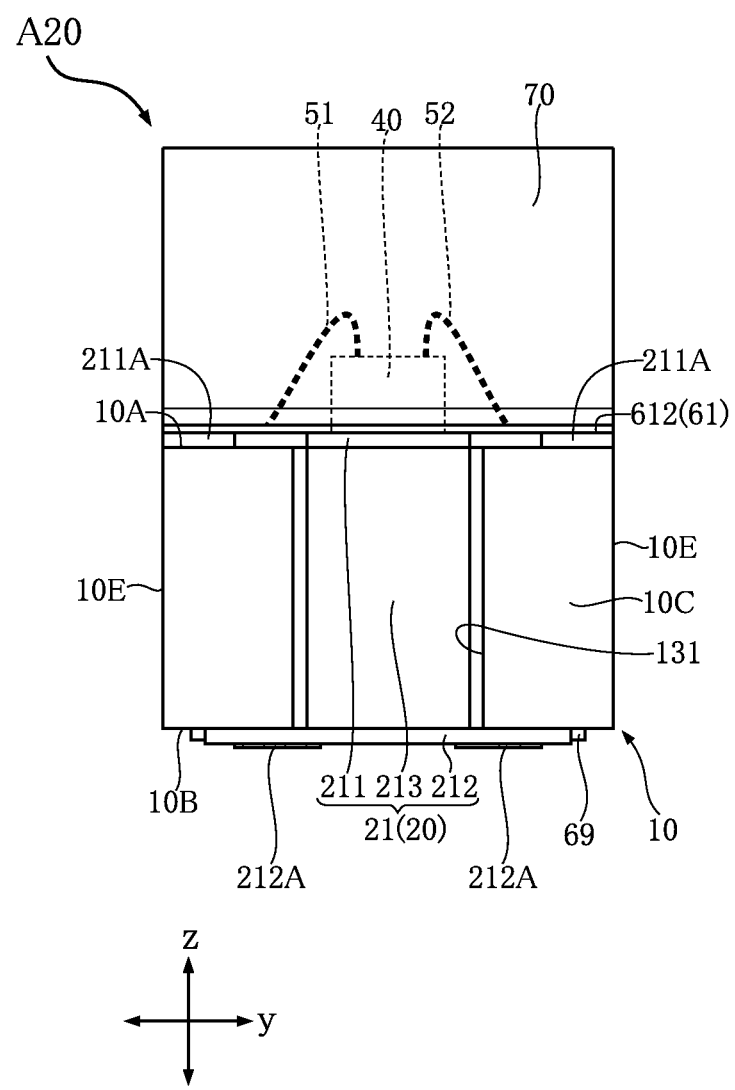
FIG. 20 is a left side view showing the LED package of FIG. 16.
Figure 21:
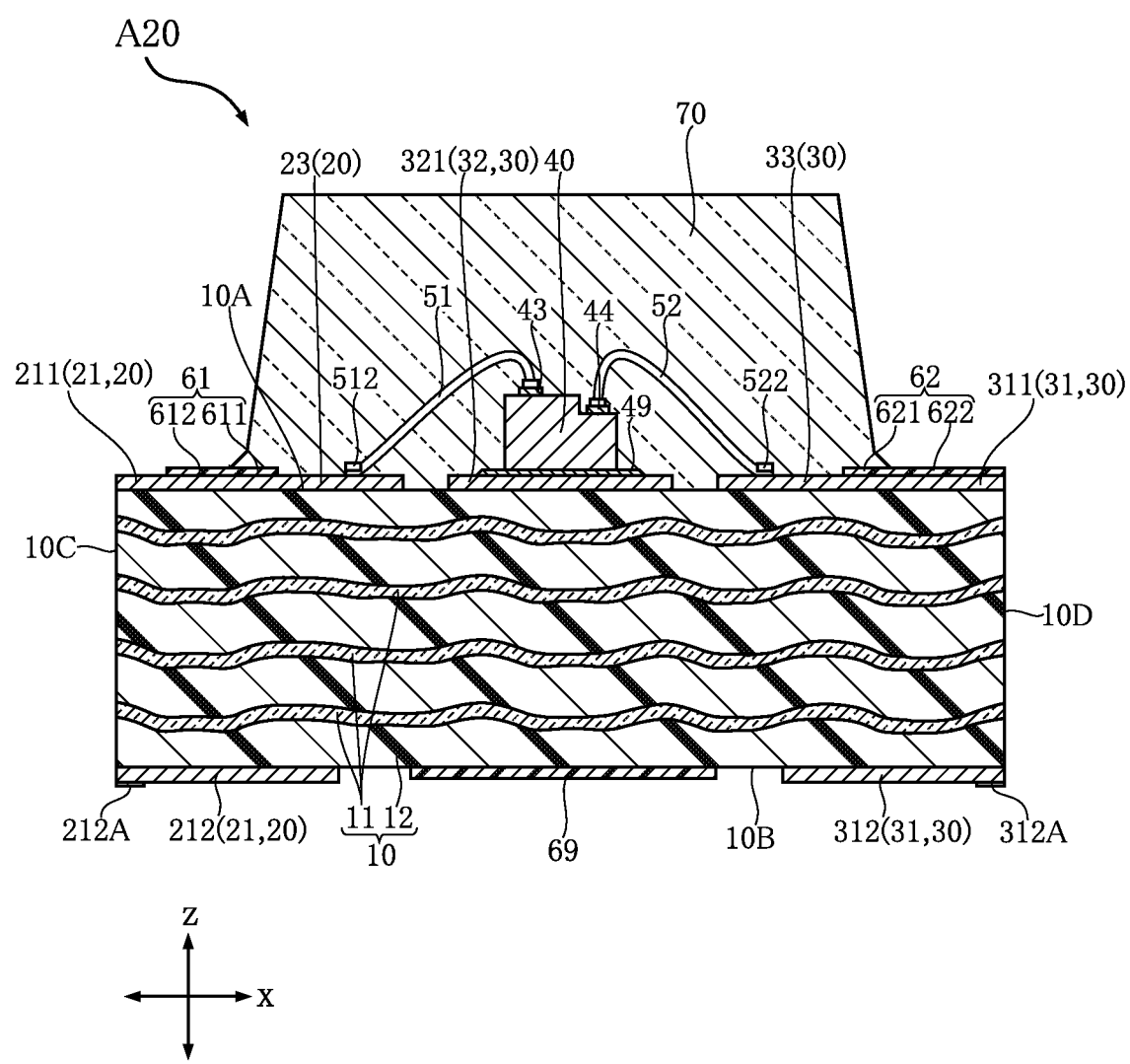
FIG. 21 is a cross-sectional view along line XXI-XXI in FIG. 17.

As shown in FIGS. 19 to 21, a substrate 10 is thicker than the substrate 10 of the LED package A10. As shown in FIG. 21, the substrate 10 includes a plurality of glass cloths 11 laminated in the thickness direction z, and an impregnated resin 12 impregnated in the plurality of glass cloths 11. The impregnated resin 12 contains acrylic resin. The acrylic resin may be polymethyl methacrylate resin. In the example of the LED package A20, the plurality of glass cloths 11 have a four-layer structure.

As shown in FIGS. 16 and 17, a first exposed portion 612 of a first insulating layer 61 has a concave cutout along the periphery of a first recess 131 of the substrate 10, as viewed in the thickness direction z. A second exposed portion 622 of a second insulating layer 62 has a rectangular cutout that surrounds the periphery of a second recess 132 of the substrate 10, as viewed in the thickness direction z. Accordingly, in the LED package A20 as well, the second exposed portion 622 has a different shape from the first exposed portion 612 as viewed in the thickness direction z.

Figure 18:
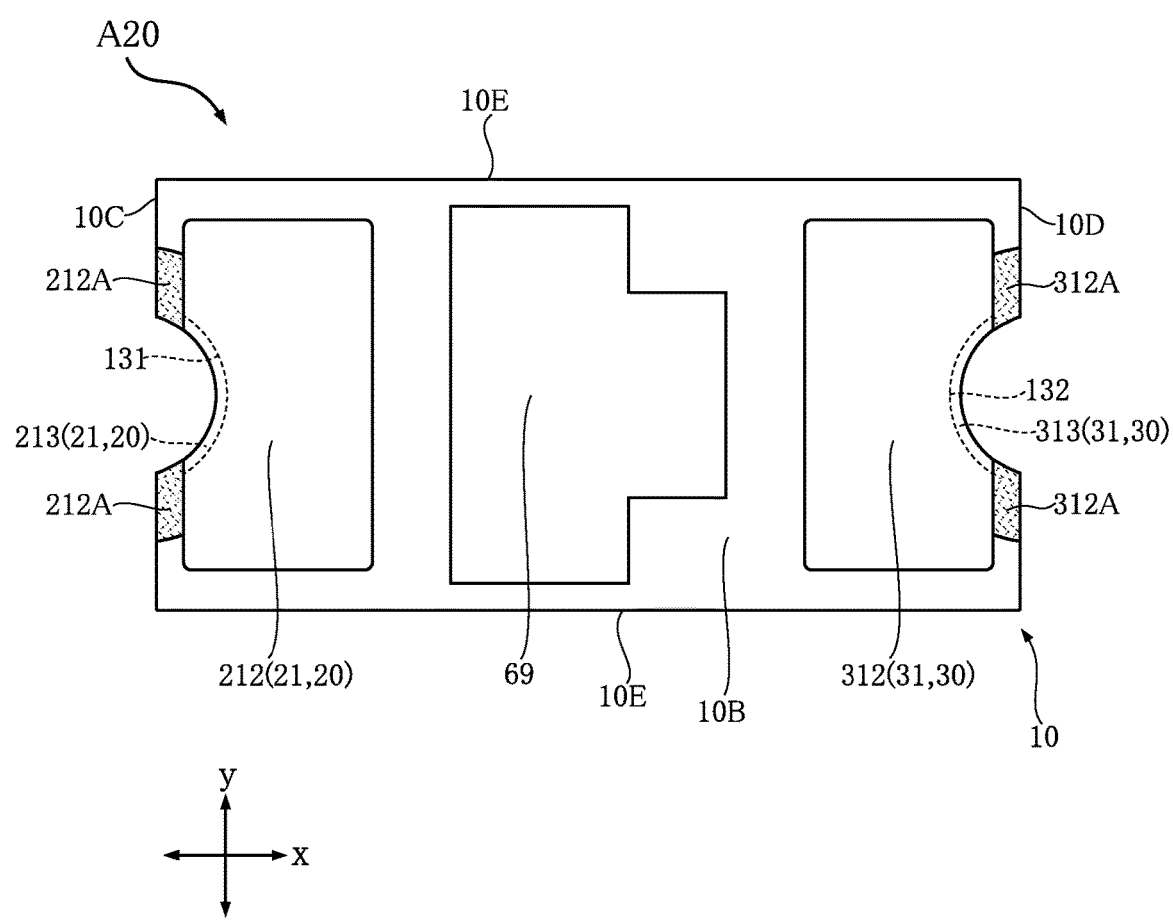
FIG. 18 is a bottom view showing the LED package of FIG. 16.

As shown in FIG. 18, a polarity mark 69 is arranged on a back surface 10B of the substrate 10. In the example of the LED package A20, the band-like portion of the polarity mark 69 extending in the second direction y indicates an anode. Accordingly, the polarity mark 69 indicates that a first back portion 212 of a first terminal portion 21 of first wiring 20 is an anode.

Figure 22:
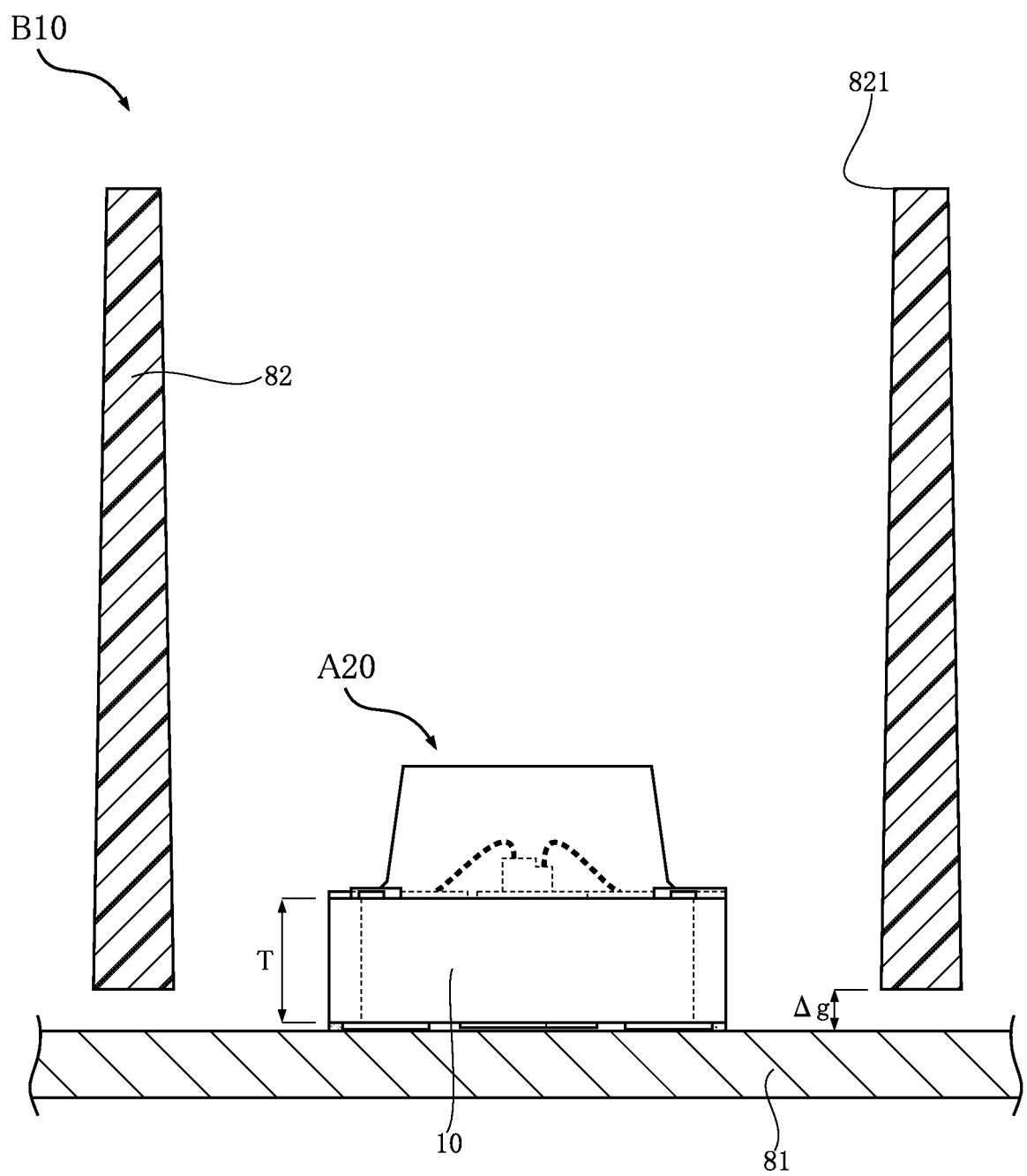
FIG. 22 is a cross-sectional view showing an LED display device according to a first embodiment of the present disclosure.
Figure 23:
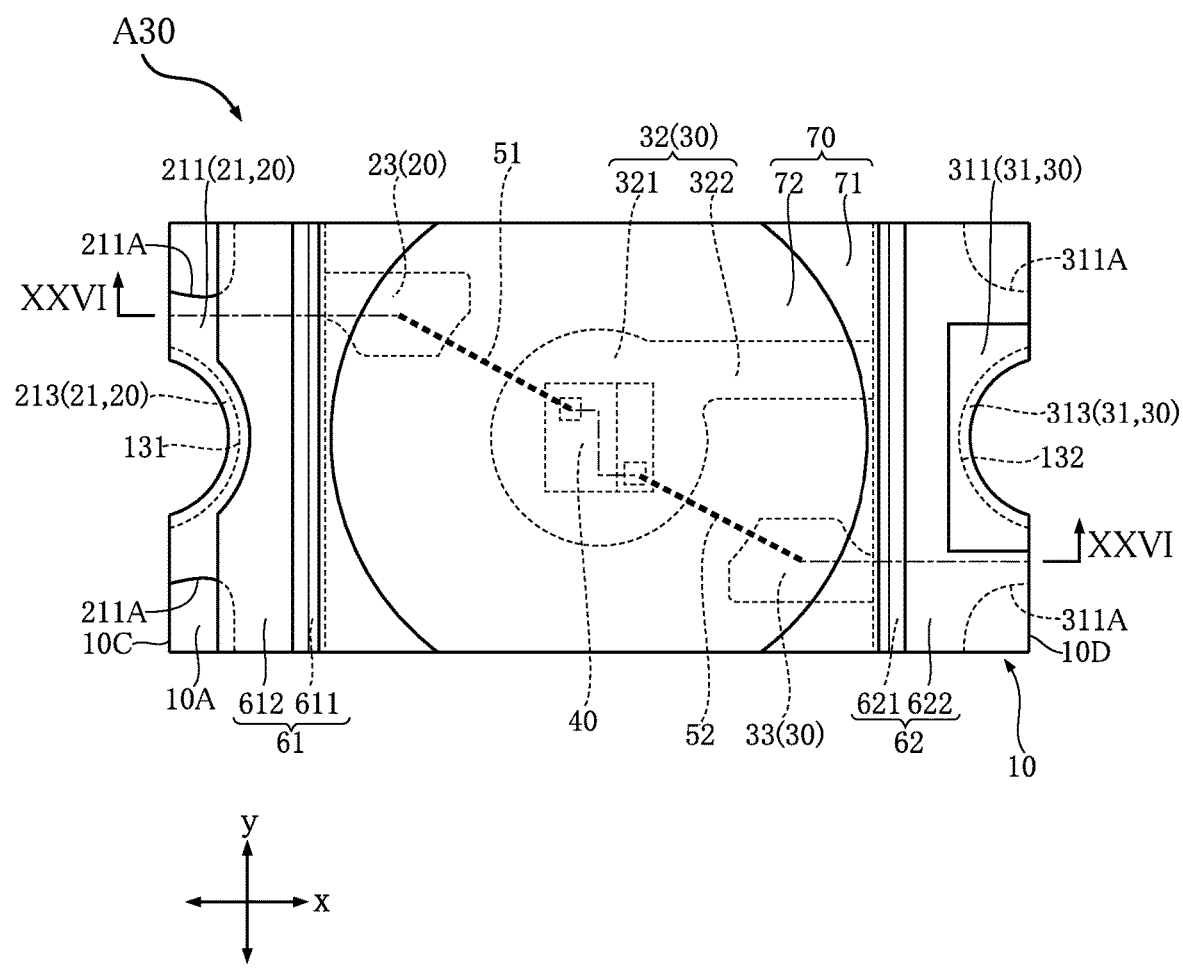
FIG. 23 is a plan view showing an LED package according to a third embodiment of the present disclosure.
Figure 24:
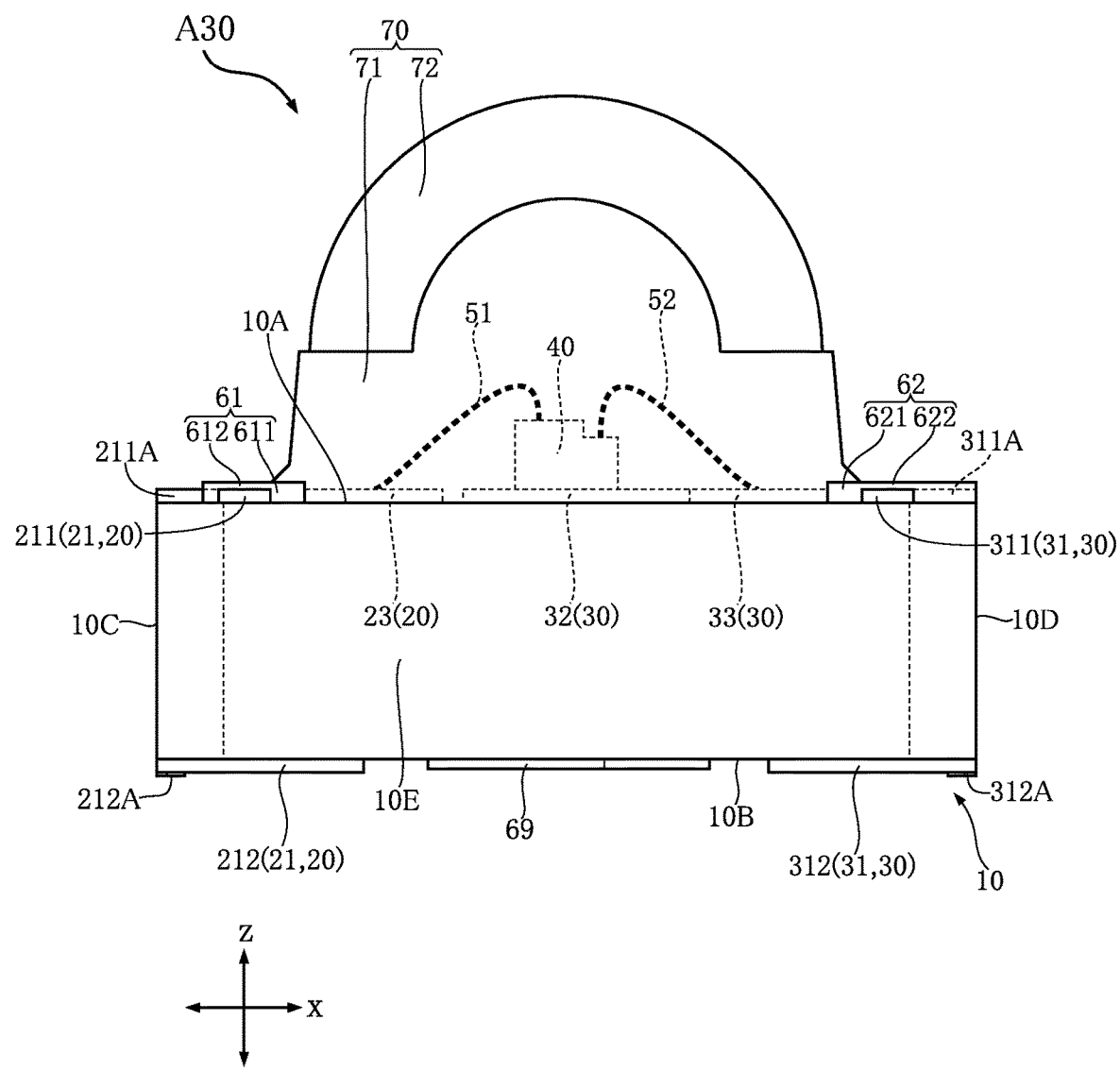
FIG. 24 is a front view showing the LED package of FIG. 23.
Figure 25:
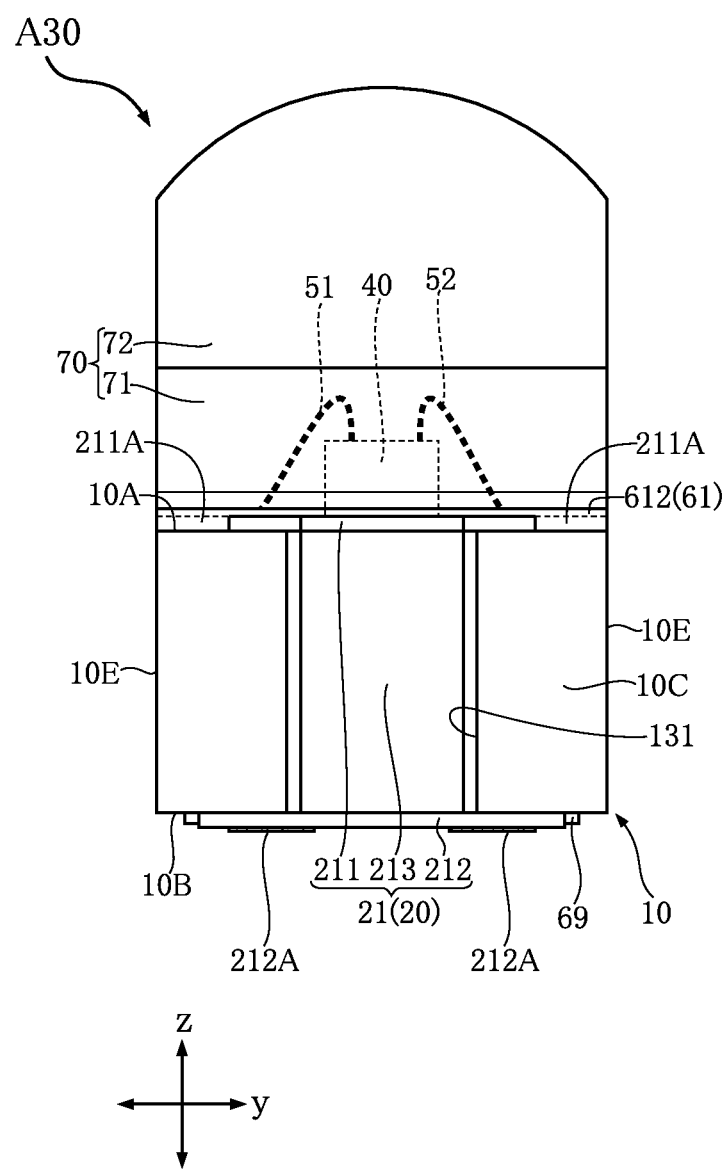
FIG. 25 is a left side view showing the LED package of FIG. 23.
Figure 26:
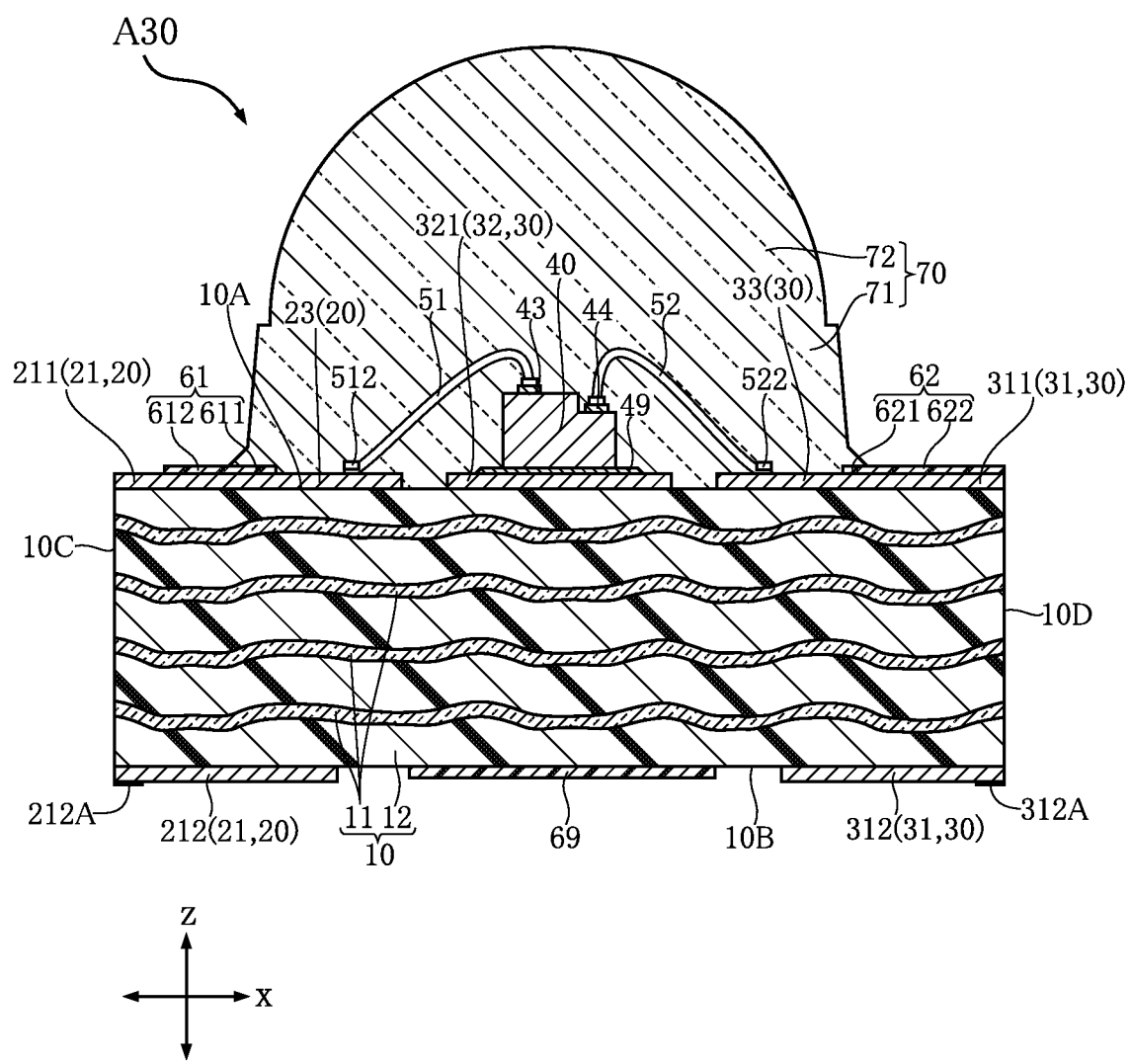
FIG. 26 is a cross-sectional view along line XXVI-XXVI in FIG. 23.

The following describes the LED display device B10 with reference to FIG. 22. The LED display device B10 includes the LED package A20, a mounting substrate 81, and a housing 82. As shown in FIG. 22, the LED display device B10 may be used for the instrument panel of a vehicle.

The mounting substrate 81 has wiring or the like formed thereon. The LED package A20 is mounted on the mounting substrate 81 by soldering. The housing 82 is provided on the same side of the mounting substrate 81 as the LED package A20, and surrounds the LED package A20. The housing 82 is made of a synthetic resin such as polypropylene resin. The housing 82 is formed by injection molding. The housing 82 has an opening 821, which is disposed at the upper end of the housing 82 in FIG. 22. In other words, the housing 82 has a first end (adjacent to the substrate 81) and a second end that is spaced apart from the first end in the thickness direction z, and the opening 821 is at the second end. In the LED display device B10, the opening 821 may be closed by a translucent plate.

A gap Δg is provided between the mounting substrate 81 and the housing 82 in the thickness direction z. The substrate 10 of the LED package A20 has a thickness T that is larger than the spacing of the gap Δg. The thickness T of the substrate 10 is preferably at least twice the spacing of the gap Δg.

The following describes advantages of the LED package A20 and the LED display device B10.

Similarly to the LED package A10, the LED package A20 includes the substrate 10 on which the first wiring 20 and second wiring 30 are arranged and on which an LED chip 40 is mounted, and also includes the sealing resin 70 covering the LED chip 40. The substrate 10 includes the plurality of glass cloths 11 laminated in the thickness direction z, and the impregnated resin 12 impregnated in the plurality of glass cloths 11. The impregnated resin 12 contains acrylic resin. The sealing resin 70 contains silicone. As such, the LED package A20 can also realize size reduction while stabilizing the amount of emitted luminous flux over a long period of time.

The LED display device B10 includes the LED package A20, the mounting substrate 81, and the housing 82. The gap Δg is set between the mounting substrate 81 and the housing 82 in the thickness direction z. The substrate 10 of the LED package A20 has the thickness T that is larger than the spacing of the gap Δg. This suppresses the amount of luminous flux emitted from the LED package A20 and leaking from the gap Δg. Furthermore, when the thickness T of the substrate 10 is at least twice the length of the gap Δg, the amount of luminous flux leaking from the gap Δg can be more effectively suppressed. This eliminates the need of arranging a light guide above the LED package A20 within the housing 82.

Next, descriptions are provided of an LED package A30 according to a third embodiment of the present disclosure and an LED display device B20 according to the second embodiment of the present disclosure, with reference to FIGS. 23 to 27. In these figures, elements that are the same as or similar to the elements of the LED package A10 and the LED display device B10 described above are provided with the same reference signs, and descriptions thereof are omitted.

The following describes the LED package A30 with reference to FIGS. 23 to 26. Note that the LED package A30 differs from the LED package A20 in the configuration of the sealing resin 70. The configuration of a substrate 10 of the LED package A30 is the same as that of the LED package A20.

As shown in FIGS. 23 to 26, a sealing resin 70 includes abase 71 and a lens portion 72. The base 71 is supported by the substrate 10, and covers an LED chip 40, a first wire 51, and a second wire 52. The base 71 further covers portions of a front surface 10A of the substrate 10, first wiring 20, second wiring 30, a first insulating layer 61, and a second insulating layer 62. The base 71 has a truncated pyramid shape. A pair of end surfaces of the base 71 facing in the second direction y are flush with a pair of third side surfaces 10E of the substrate 10. The lens portion 72 is spaced apart from the LED chip 40 in the thickness direction z. The lens portion 72 is connected to the base 71. The lens portion 72 protrudes in the thickness direction z. The sealing resin 70 is made of an epoxy resin that contains silicone, similarly to the sealing resin 70 of the LED package A10.

Figure 27:
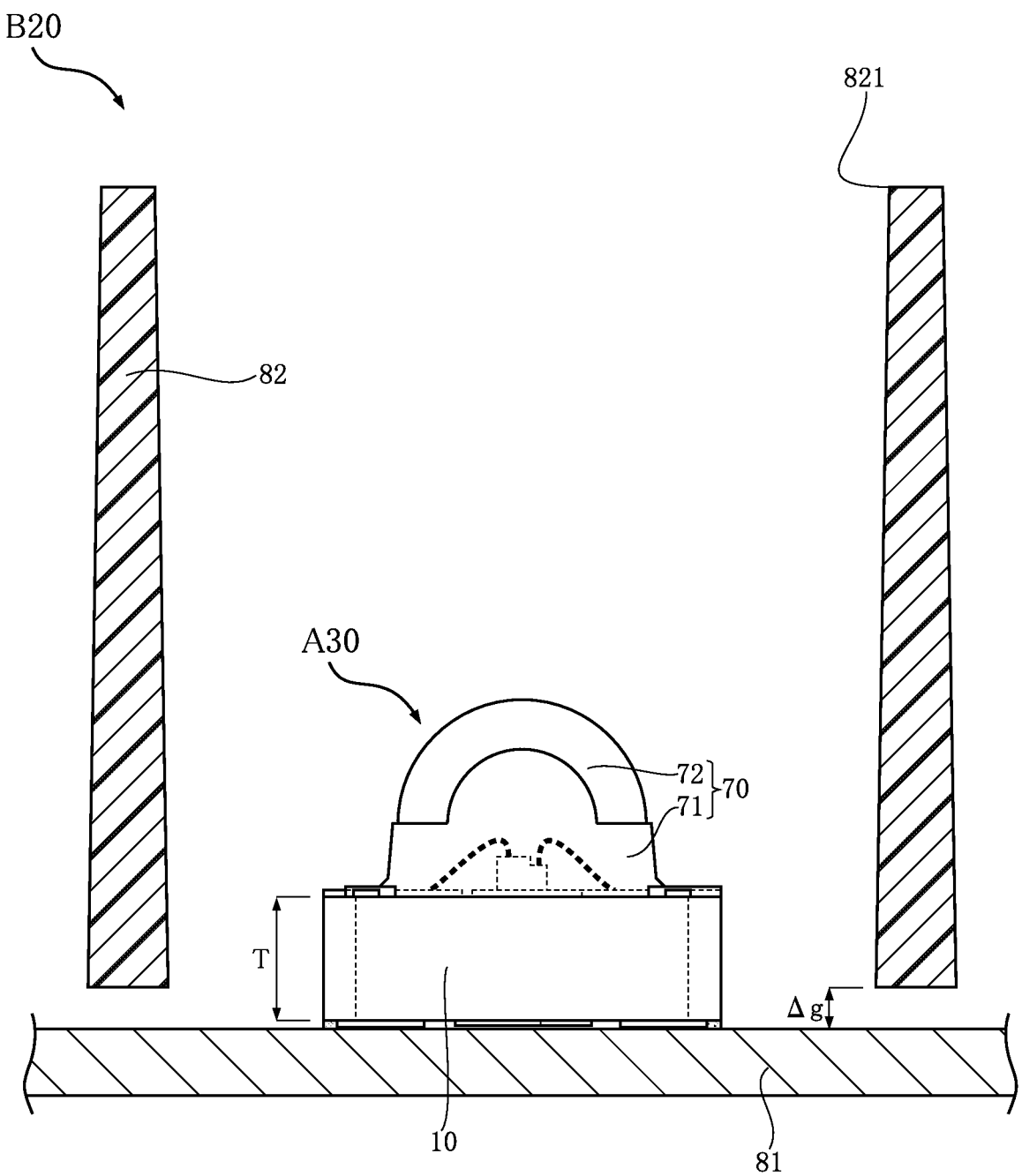
FIG. 27 is a cross-sectional view showing an LED display device according to the second embodiment of the present disclosure.

The following describes the LED display device B20 with reference to FIG. 27. The LED display device B20 differs from the LED display device B10 in that the LED display device B20 includes the LED package A30 instead of the LED package A20.

The gap Δg is set between a mounting substrate 81 and a housing 82 in the thickness direction z. The substrate 10 of the LED package A30 has the thickness T that is larger than the spacing of the gap Δg. The thickness T of the substrate 10 is preferably at least twice the spacing of the gap Δg.

The following describes advantages of the LED package A30 and the LED display device B20.

Similarly to the LED package A10, the LED package A30 includes the substrate 10 on which the first wiring 20 and the second wiring 30 are arranged and on which the LED chip 40 is mounted, and also includes the sealing resin 70 covering the LED chip 40. The substrate 10 includes a plurality of glass cloths 11 laminated in the thickness direction z, and an impregnated resin 12 impregnated in the plurality of glass cloths 11. The impregnated resin 12 contains acrylic resin. The sealing resin 70 contains silicone. As such, the LED package A30 can also realize size reduction while stabilizing the amount of emitted luminous flux over a long period of time.

The LED display device B20 includes the LED package A30, the mounting substrate 81, and the housing 82. The gap Δg is set between the mounting substrate 81 and the housing 82 in the thickness direction z. The substrate 10 of the LED package A30 has the thickness T that is larger than the spacing of the gap Δg. This suppresses the amount of luminous flux emitted from the LED package A30 and leaking from the gap Δg.

The sealing resin 70 has the lens portion 72 that is spaced apart from the LED chip 40 in the thickness direction z. The lens portion 72 protrudes in the thickness direction z. This improves the directivity of the light emitted from the LED package A30. This allows the LED display device B20 to suppress the amount of luminous flux leaking from the gap Δg more effectively. Accordingly, it is unnecessary to arrange a light guide above the LED package A30 within the housing 82.

The present disclosure is not limited to the above embodiments. Various design changes can be made to the specific configurations of the elements in the present disclosure.

The invention claimed is:

1. An LED package, comprising:
   a substrate having a front surface and a back surface that are spaced apart from each other in a thickness direction, wherein
      the substrate has a first side surface and a first recess, the first side surface facing in a first direction perpendicular to the thickness direction and being connected to the front surface and the back surface, the first recess being recessed from the first side surface and extending from the front surface to the back surface;

a first wiring and a second wiring arranged on the substrate;

an LED chip mounted on the front surface and electrically connected to the first wiring and the second wiring, wherein the first wiring includes a first connecting portion and a first terminal portion, the first connecting portion being arranged on the front surface and electrically connected to the LED chip, the first terminal portion being connected to the first connecting portion, and the first terminal portion is in contact with the front surface and the first recess; and a sealing resin covering the LED chip, wherein the substrate comprises a plurality of glass cloths laminated in the thickness direction and an impregnated resin impregnated in the plurality of glass cloths, the impregnated resin comprises acrylic resin, and the sealing resin comprises silicone.

2. The LED package according to claim 1, wherein the substrate has a second side surface and a second recess, the second side surface facing opposite from the first side surface and being connected to the front surface and the back surface, the second recess being recessed from the second side surface and extending from the front surface to the back surface, the second wiring includes a mounting portion on which the LED chip is mounted, a second connecting portion electrically connected to the LED chip, and a second terminal portion connected to the mounting portion and the second connecting portion, and the second terminal portion is in contact with the front surface and the second recess.

3. The LED package according to claim 2, further comprising a first insulating layer, wherein the first terminal portion includes a first front portion and a first side portion, the first front portion being in contact with the front surface and connected to the first connecting portion, the first side portion being in contact with the first recess and connected to the first front portion, the first insulating layer covers at least a portion of the first front portion and includes a first intervening portion positioned between the front surface and the sealing resin in the thickness direction, and the front surface has a first edge and a second edge that are spaced apart from each other in a second direction perpendicular to the thickness direction and the first direction, and the first insulating layer extends to the first edge and the second edge of the front surface.

4. The LED package according to claim 3, further comprising a second insulating layer, wherein the second terminal portion includes a second front portion and a second side portion, the second front portion being in contact with the front surface and connected to the mounting portion and the second connecting portion, the second side portion being in contact with the second recess and connected to the second front portion, wherein the second insulating layer covers at least a portion of the second front portion and includes a second intervening portion positioned between the front surface and the sealing resin in the thickness direction, and the second insulating layer extends to the first edge and the second edge of the front surface.

5. The LED package according to claim 4, wherein the first insulating layer includes a first exposed portion connected to the first intervening portion and exposed from the sealing resin, the second insulating layer includes a second exposed portion connected to the second intervening portion and exposed from the sealing resin, and the second exposed portion differs in shape from the first exposed portion as viewed in the thickness direction.

6. The LED package according to claim 5, wherein the first exposed portion has a band shape extending in the second direction, and the second exposed portion has a curved edge along a periphery of the second recess.

7. The LED package according to claim 5, wherein each of the first insulating layer and the second insulating layer is made of a resist film.

8. The LED package according to claim 5, wherein the first front portion is formed with a pair of first cutouts spaced apart from each other in the second direction, and each of the first cutouts is recessed away from a corner of the front surface so that a portion of the front surface is exposed from said each of the first cutouts.

9. The LED package according to claim 8, wherein the second front portion is formed with a pair of second cutouts spaced apart from each other in the second direction, an each of the second cutouts is recessed away from a corner of the front surface so that a portion of the front surface is exposed from said each of the second cutouts.

10. The LED package according to claim 9, wherein the second cutouts differ in shape from the first cutouts.

11. The LED package according to claim 9, wherein the first terminal portion includes a first back portion that is in contact with the back surface and connected to the first side portion, and the first back portion is provided with a first bump that is adjacent to a boundary between the back surface and the first side surface and that protrudes in the thickness direction.

12. The LED package according to claim 11, wherein the second terminal portion includes a second back portion that is in contact with the back surface and connected to the second side portion, and the second back portion is provided with a second bump that is adjacent to a boundary between the back surface and the second side surface and that protrudes in the thickness direction.

13. The LED package according to claim 5, wherein the first connecting portion and the second connecting portion overlap with a diagonal line of the front surface as viewed in the thickness direction, and a center of the front surface is positioned between the first connecting portion and the second connecting portion as viewed in the thickness direction.

14. The LED package according to claim 13, further comprising a first wire, a second wire, a first columnar connector and a second columnar connector, wherein the first wire has a first end connected to the first connecting portion and a second end connected to the LED chip, the second wire has a first end connected to the second connecting portion and a second end connected to the LED chip, the first columnar connector is disposed on the first end of the first wire, and the second columnar connector is disposed on the first end of the second wire.

15. The LED package according to claim 5, wherein the sealing resin includes a lens portion spaced apart from the LED chip in the thickness direction and having a protruding shape in the thickness direction.

16. An LED display device, comprising:
an LED package according to claim 1;
a mounting substrate on which the LED package is mounted; and
a housing surrounding the LED package,
wherein a gap is formed between the mounting substrate and the housing in the thickness direction, and
the substrate of the LED package has a thickness that is larger than spacing of the gap.

\* \* \* \* \*